United States Patent
Liaw

(10) Patent No.: US 10,643,688 B2
(45) Date of Patent: *May 5, 2020

(54) STATIC RANDOM ACCESS MEMORY (SRAM) TRACKING CELLS AND METHODS OF FORMING THE SAME

(71) Applicant: Taiwan Semiconductor Manufacturing Company, Ltd., Hsinchu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/230,643

(22) Filed: Dec. 21, 2018

(65) Prior Publication Data

US 2019/0147945 A1     May 16, 2019

Related U.S. Application Data

(63) Continuation of application No. 15/728,345, filed on Oct. 9, 2017, now Pat. No. 10,163,496, which is a (Continued)

(51) Int. Cl.
*G11C 5/06* (2006.01)
*G11C 11/419* (2006.01)
*H01L 49/02* (2006.01)

(52) U.S. Cl.
CPC ............ *G11C 11/419* (2013.01); *H01L 28/00* (2013.01)

(58) Field of Classification Search
CPC ...... G11C 16/26; G11C 16/0483; G11C 16/10; G11C 16/08; G11C 16/24; G11C 11/5628;
(Continued)

(56) References Cited

U.S. PATENT DOCUMENTS 6,373,745 B2   4/2002   Saito et al.
7,684,274 B2   3/2010   Rengarajan et al.
(Continued)

FOREIGN PATENT DOCUMENTS

CN   102385914 A   3/2012
CN   103456346 A   12/2013

OTHER PUBLICATIONS

Osada, et al., "Universal-Vdd 0.65-2.0V 32kB Cache using Voltage-Adapted Timing-Generation Scheme and a Lithographical-Symmetric Cell," ISSCC 2001, Session 11, SRA, 11.1, 3 pages.

*Primary Examiner* — Thong Q Le
(74) *Attorney, Agent, or Firm* — Slater Matsil, LLP

(57) ABSTRACT

An embodiment static random access memory (SRAM) array includes a writable SRAM cell disposed in a first row of the SRAM array and an SRAM read current tracking cell in the first row of the SRAM array. The SRAM current tracking cell includes a first read pull-down transistor and a first read pass-gate transistor. The first read pull-down transistor includes a first gate electrically connected to a first positive supply voltage line; a first source/drain electrically connected to a first ground line; and a second source/drain. The first read pass-gate transistor includes a third source/drain electrically connected to the second source/drain and a fourth source/drain electrically connected to a read tracking bit line (BL). The read tracking BL is electrically connected to a read sense amplifier timing control circuit.

20 Claims, 25 Drawing Sheets

Related U.S. Application Data continuation of application No. 15/144,346, filed on May 2, 2016, now Pat. No. 9,786,359.

(60) Provisional application No. 62/288,988, filed on Jan. 29, 2016.

(58) Field of Classification Search
CPC .............. G11C 11/4076; G11C 11/419; G11C 16/3459; G11C 11/5642; G11C 11/5671; G11C 7/222
See application file for complete search history.

(56) References Cited

U.S. PATENT DOCUMENTS

| | | |
|---|---|---|
| 8,605,523 B2 | 12/2013 | Tao et al. |
| 8,630,132 B2 | 1/2014 | Cheng et al. |
| 8,760,948 B2 | 6/2014 | Tao et al. |
| 10,163,496 B2* | 12/2018 | Liaw ................... H01L 28/00 |
| 2008/0022047 A1 | 1/2008 | Ramaraju et al. |
| 2009/0147606 A1 | 6/2009 | Rengarajan et al. |
| 2012/0051160 A1 | 3/2012 | Tao et al. |
| 2013/0064031 A1 | 3/2013 | Phan et al. |
| 2013/0258760 A1* | 10/2013 | Hold .................... G11C 11/412 365/154 |
| 2014/0032871 A1 | 1/2014 | Hsu et al. |
| 2014/0085993 A1 | 3/2014 | Tao et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0233330 A1 | 8/2014 | Ko et al. |
| 2014/0241077 A1 | 8/2014 | Katoch et al. |
| 2014/0269114 A1 | 9/2014 | Yang et al. |
| 2015/0131391 A1 | 5/2015 | Hsu et al. |
| 2015/0213857 A1 | 7/2015 | Wang et al. |

\* cited by examiner

STATIC RANDOM ACCESS MEMORY (SRAM) TRACKING CELLS AND METHODS OF FORMING THE SAME

PRIORITY CLAIM AND CROSS-REFERENCE

This application is a continuation of U.S. application Ser. No. 15/728,345, Oct. 9, 2017, which is a continuation of U.S. application Ser. No. 15/144,346, filed May 2, 2016, now U.S. Pat. No. 9,786,359, issued Oct. 10, 2018, which claims the benefits of U.S. Provisional Application Ser. No. 62/288,988, filed on Jan. 29, 2016, which applications are hereby incorporated herein by reference in their entirety.

BACKGROUND

Static random access memory (SRAM) arrays are commonly used for data storage in integrated circuit devices. Recent advances in fin field effect transistor (finFET) technology have made advanced SRAM cells using finFET transistors possible. SRAM array performance is often layout dependent. For example, a position at which an SRAM cell lines in an SRAM array sometimes causes an inner cell of an SRAM array to perform differently from an edge cell of the SRAM array. Thus, SRAM cell layouts may be used to improve the performance of an SRAM array.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
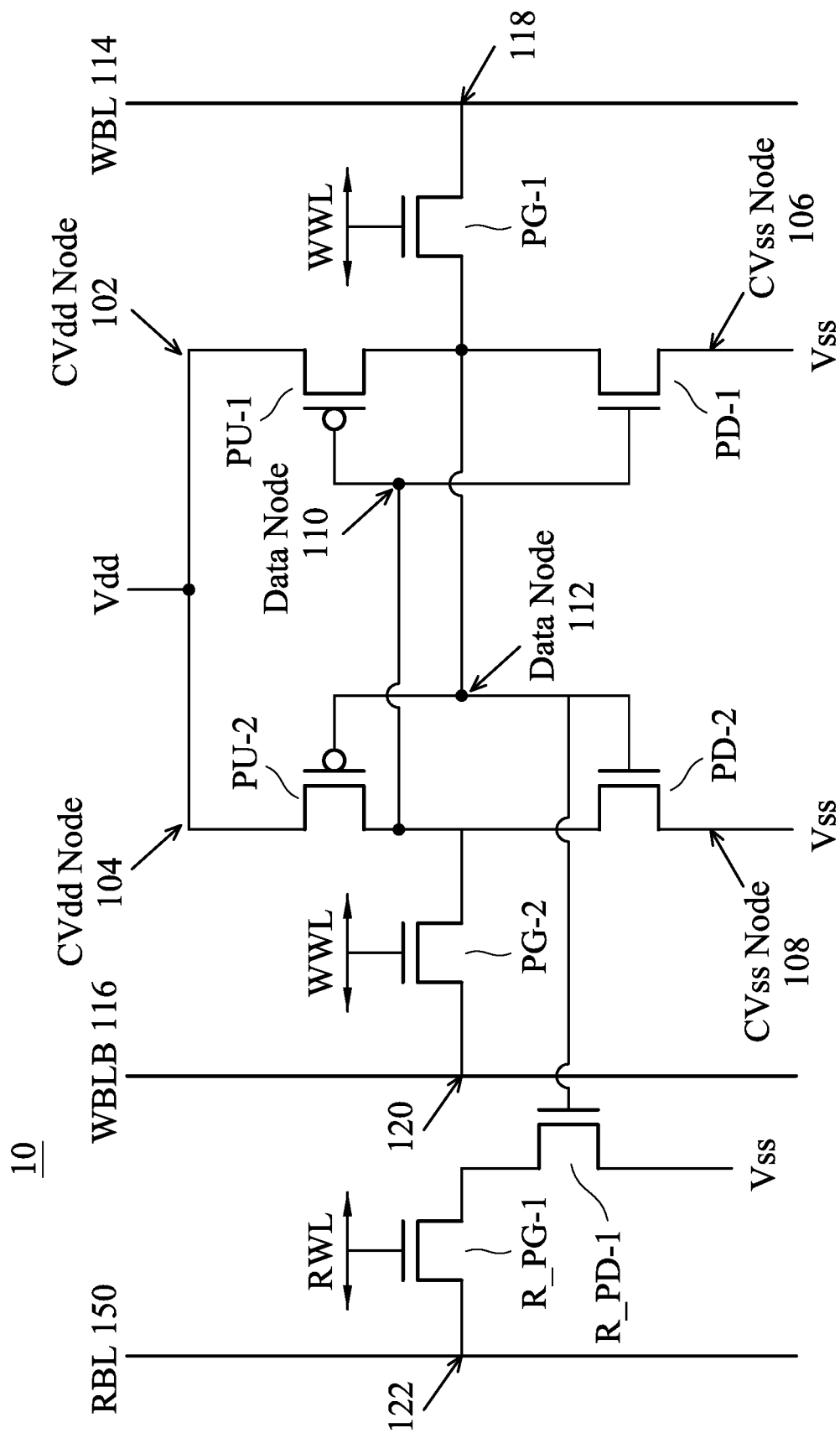
FIGS. 1 and 2 illustrate circuit diagrams of a static random access memory (SRAM) cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static random access memory (SRAM) cells, SRAM tracking cells, and the corresponding SRAM array are provided in accordance with various exemplary embodiments. Some variations of some embodiments are discussed. Throughout the various views and illustrative embodiments, like reference numbers are used to designate like elements.

FIG. 1 illustrates a circuit diagram of SRAM cell 10 in accordance with some embodiments. SRAM cell 10 is an eight transistor (8T) cell having a write port and a read port separate from the write port. Because SRAM cell 10 has separate write and read ports, SRAM cell 10 may be referred to as a two port SRAM cell. SRAM cell 10 includes pull-up transistors PU-1 and PU-2, which are P-type Metal-Oxide-Semiconductor (PMOS) transistors, and pull-down transistors PD-1 and PD-2 and pass-gate transistors PG-1 and PG-2, which are N-type Metal-Oxide-Semiconductor (NMOS) transistors. A latch formed of pull-up transistors PU-1 and PU-2 and pull-down transistors PD-1 and PD-2 stores a bit, wherein the complementary values of the bit are stored in storage date (SD) node 110 and SD node 112. The stored bit can be written into SRAM cell 10 through complementary write bit lines including write bit line (WBL) 114 and write bit line bar (WBLB) 116. Thus, SRAM cell 10 may be referred to as a writable SRAM cell because it is capable of having bits written into it.

SRAM cell 10 is powered through a positive power supply node Vdd that has a positive power supply voltage (also denoted as CVdd). SRAM cell 10 is also connected to power supply voltage Vss (also denoted as CVss), which may be an electrical ground. Transistors PU-1 and PD-1 form a first inverter. Transistors PU-2 and PD-2 form a second inverter. The input of the first inverter is connected to transistor PG-1 and the output of the second inverter. The output of the first inverter is connected to transistor PG-2 and the input of the second inverter.

The sources of pull-up transistors PU-1 and PU-2 are connected to CVdd node 102 and CVdd node 104, respectively, which are further connected to power supply voltage (and line) Vdd. The sources pull-down transistors PD-1 and PD-2 are connected to CVss node 106 and CVss node 108, respectively, which are further connected to power supply voltage (and line) Vss. The gates of transistors PU-1 and PD-1 are connected to the drains of transistors PU-2 and PD-2, which form a connection node that is referred to as SD node 110. The gates of transistors PU-2 and PD-2 are connected to the drains of transistors PU-1 and PD-1, which connection node is referred to as SD node 112. A source/drain region of pass-gate transistor PG-1 is connected to WBL 114 at a WBL node 118. A source/drain region of pass-gate transistor PG-2 is connected to WBLB 116 at a WBLB node 120.

The gates of pass-gate transistors PG-1 and PG-2 are controlled by a write word line (WWL) that determines whether SRAM cell 10 is selected or not for write operations. During write operations, WBL 114 and WBWB 116 are pre-charged with complementary bits, which are used to set SD nodes 110 and 112 to a desired value. After WBL114 and WBWB 116 are pre-charged, WWL is charged logical high to select SRAM cell 10 for write operations. The complementary values of WBLB 116 and WBL 114 are then stored into SD nodes 110 and 112, respectively.

SRAM cell 10 further includes a read pull-down transistor R_PD-1 and a read pass-gate transistor R_PG-1, which are N-type Metal-Oxide-Semiconductor (NMOS) transistors. SD node 112 is connected to a gate of read pull-down transistor R_PD-1. A source of read pull-down transistor R_PD-1 is connected to power supply voltage/line Vss, and a drain of read pull-down transistor R_PD-1 is connected to a source of read pass-gate transistor R_PG-1. A gate of read pass-gate transistor R_PG-1 is controlled by a read word line (RWL), that determines whether SRAM cell 10 is selected or not for read operations. A read bit line (RBL) 150 is connected to a drain of read pull-down transistor R_PD-1 at RBL node 122 and is used to read a value of SD node 112 during read operations.

During read operations, RBL 150 is pre-charged to logical high. The RWL then applies a positive supply voltage to a gate of read pass-gate transistor R_PG-1 to select SRAM cell 10 for read operations. The value of SD node 112 is then determined based on whether the value of RBL 150 changes after RWL is charged. For example, when the value of SD node 112 is at logical low, RBL 150 remains the same (e.g., logical high). In contrast, when the value of SD node 112 is at logical high, RBL 150 is discharged to CVss (e.g., ground voltage) through read pass-gate transistor R_PG-1 and read pull-down transistor R_PD-1.

Figure 2:
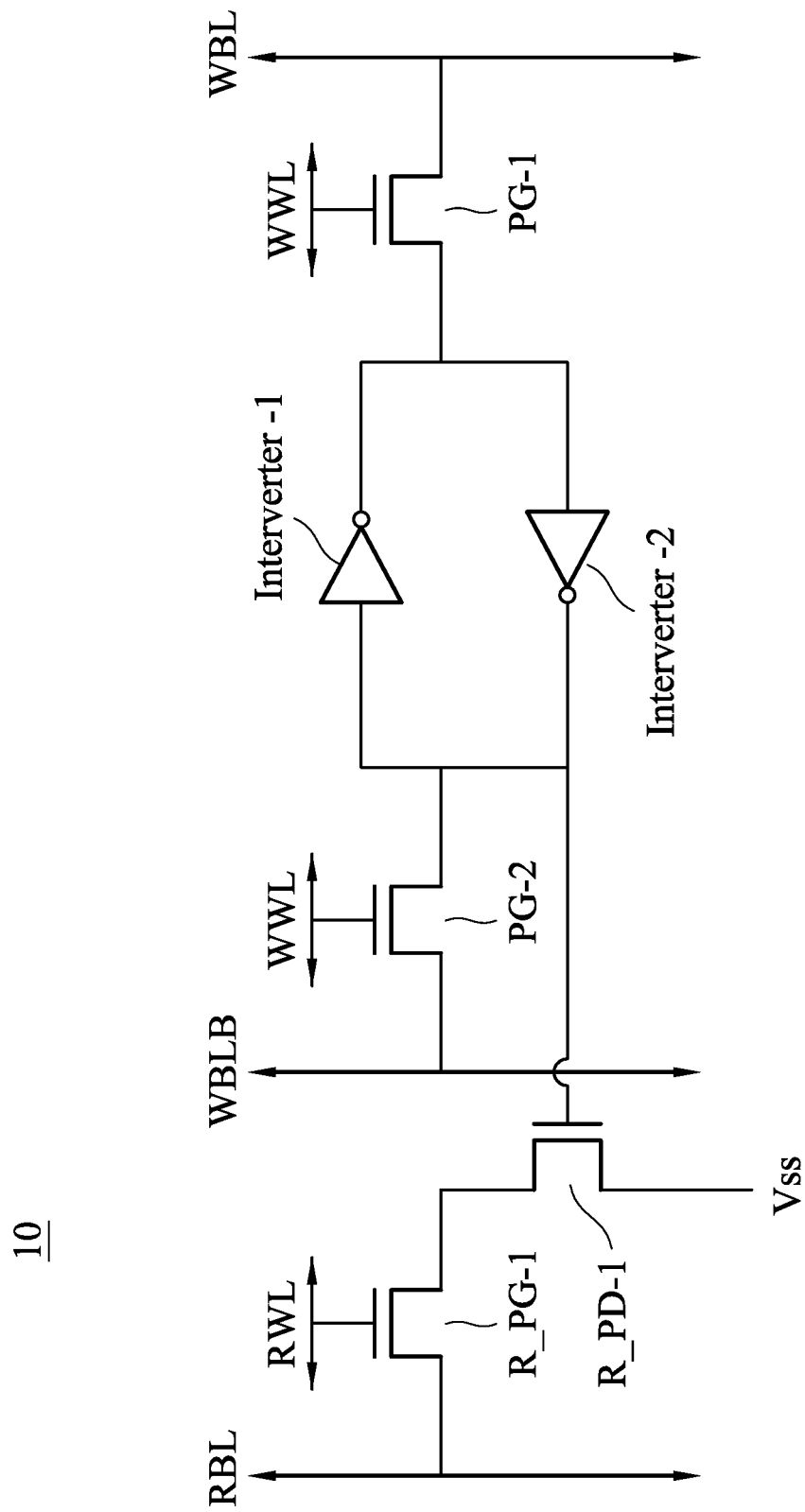

FIG. 2 illustrates an alternative circuit diagram of SRAM cell 10, wherein transistors PU-1 and PD-1 in FIG. 1 are represented as first inverter Inverter-1, and transistors PU-2 and PD-2 are represented as second inverter Inverter-2. The output of first inverter Inverter-1 (e.g., corresponding to SD node 112) is connected to transistor PG-1 and the input of the second inverter Inverter-2. The output of second inverter Inverter-2 (e.g., corresponding to SD node 110) is connected to transistor PG-2 and the input of first inverter Inverter-1. The output of second inverter Inverter-2 is further connected to a gate of a read pull-down transistor R_PD-1. Thus, transistors PU-2/PD-2 and PU-1/PD-1 form a pair of cross connected inverters Inverter-1 and Inverter-2.

Figure 3:
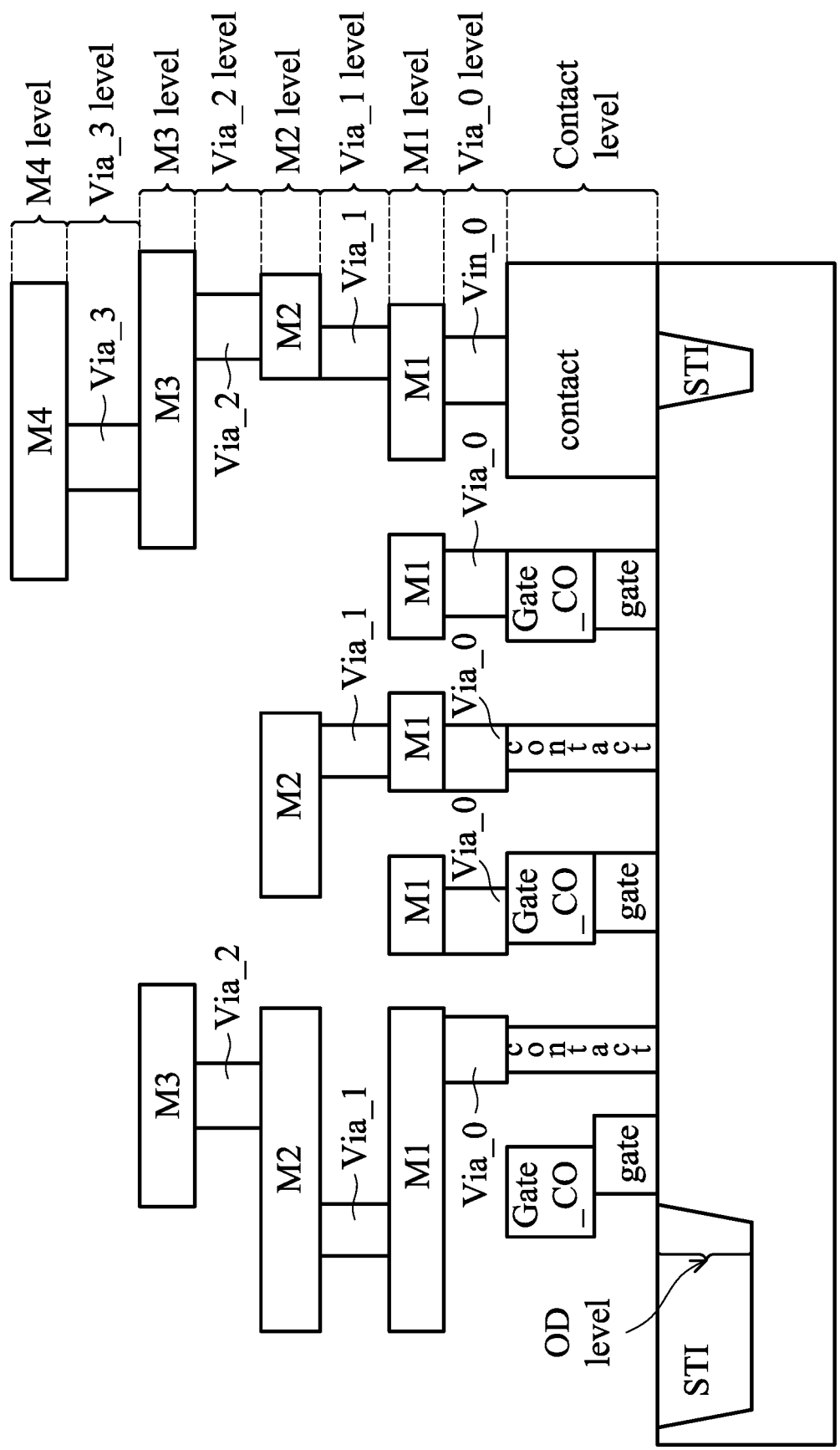
FIG. 3 illustrates a cross-sectional view of the layers involved in an SRAM cell array in accordance with some embodiments.

FIG. 3 illustrates a schematic cross-sectional view of a plurality of layers involved in SRAM cell 10, which layers are formed on a semiconductor chip or wafer. It is noted that FIG. 3 is schematically illustrated to show various levels of interconnect structure and transistors, and may not reflect the actual cross-sectional view of SRAM cell 10. The interconnect structure includes a contact level, an OD (wherein the term "OD" represents "active region") level, via levels Via_0 level, Via_1 level, Via_2 level, and Via_3 level, and metal-layer levels M1 level, M2 level, M3 level, and M4 level. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated exemplary transistors PU-1 and PU-2) to an overlying level such as the Via_0 level, and source/drain contacts (marked as "contact") for connecting the source/drain regions of transistors to the overlying level.

Figure 4A:
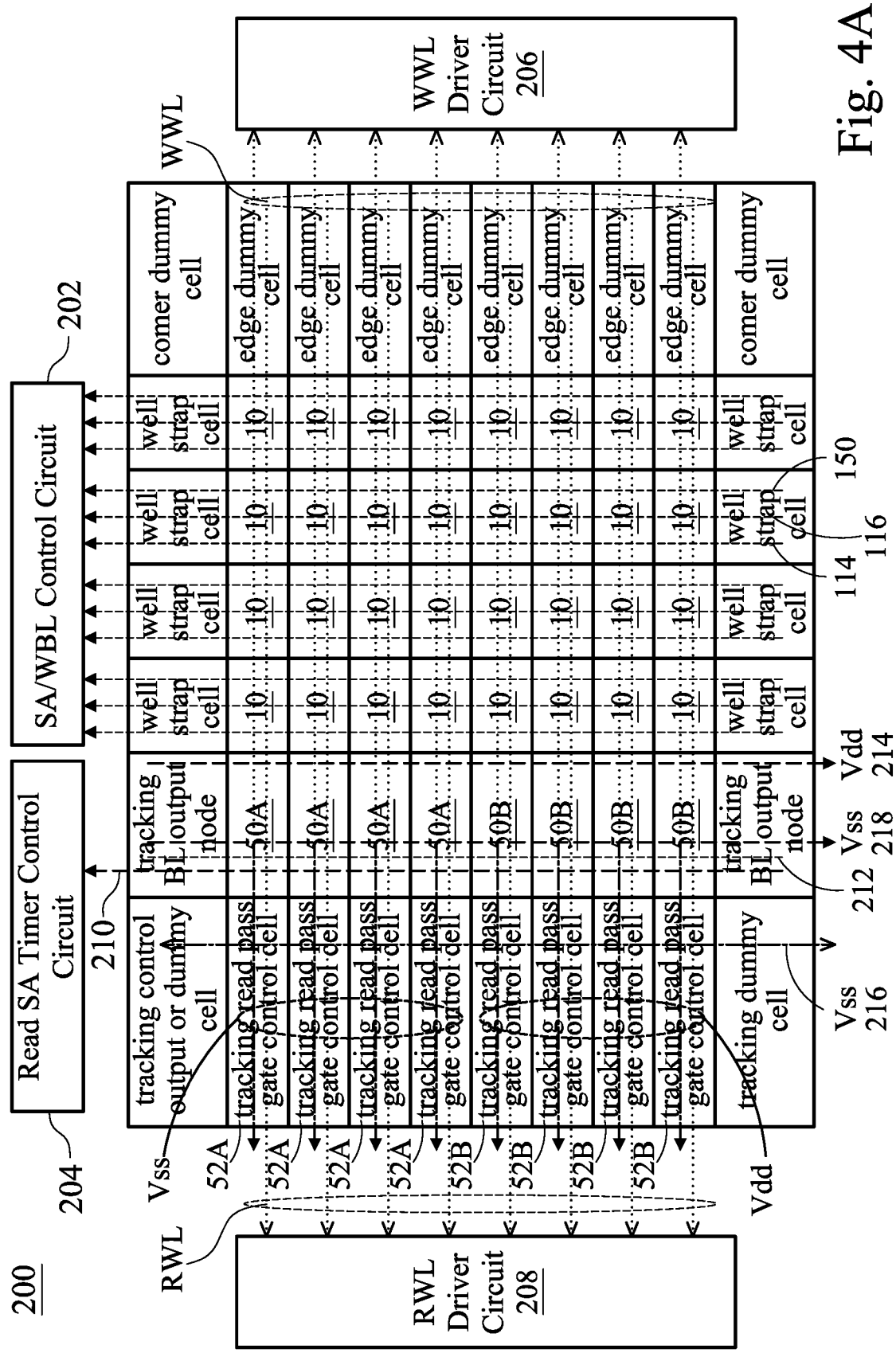
FIG. 4A through 4C illustrate block diagrams of SRAM arrays in accordance with some embodiments.

Generally, multiple SRAM cells are arranged in a semiconductor die as an SRAM array. FIG. 4A illustrates a block diagram of SRAM array 200 according to some embodiments. In an embodiment, each SRAM cell 10 in SRAM array 200 has a circuit layout as described above with respect to FIGS. 1 through 3. Other SRAM circuit layouts may be used in other embodiments. For example, FIGS. 1 through 3 illustrate an SRAM circuit layout with eight transistors having separate read and write ports. Other embodiments may include SRAM cells 10 having a different number of transistors, and various embodiments are not limited to a particular memory cell circuit.

SRAM cells 10 in each SRAM array 200 may be arranged in rows and columns. In an embodiment, SRAM array 200 may include any number of SRAM cells, such as, 64×64 SRAM cells, 128×128 SRAM cells, 256×256 SRAM cells, or the like. Other embodiments may include SRAM arrays having a different number of memory cells, such as fewer or more memory cells.

Generally, SRAM cells 10 in a same column share a common WBL 114 and WBLB 116. For example, each SRAM cell 10 in a same column includes a portion of a WBL and a WBLB, which when combined with other SRAM cells 10 in the column forms continuous conductive lines (e.g., WBL 114 and WBLB 116). WBLs 114 and WBLBs 116 are electrically connected to control circuitry 202, which activates certain WBLs 114 and WBLBs 116 to select a particular column in SRAM array 200 for write operations. In some embodiments, control circuitry 202 may further include amplifiers to enhance a write signal. For example, control circuitry 202 may include write bit line selector circuitry, write sense amplifier (SA) circuitry, combinations thereof, and the like.

Figure 4B:
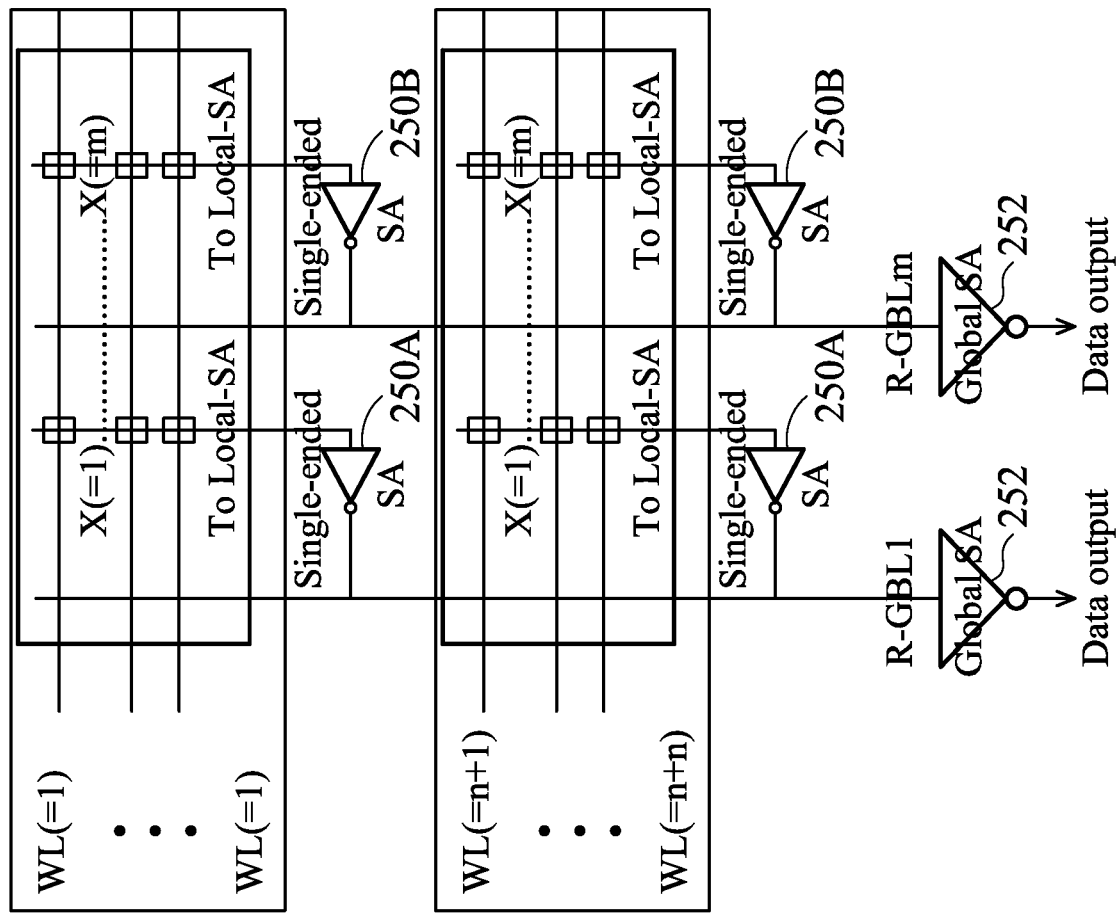

As further illustrated by FIG. 4A, SRAM cells 10 in a same column also share a common RBL 150. For example, each SRAM cell 10 in a same column includes a portion of a RBL, which when combined with other SRAM cells 10 in the column forms continuous conductive lines (e.g., RBL 150). RBLs 150 are also electrically connected to control circuitry 202, which activates certain RBLs to select a particular column in SRAM array 200 for read operations. In some embodiments, control circuitry 202 may include read bit line selector circuitry, read SA circuitry, combinations thereof, and the like. In some embodiments, SRAM cells 10 in a same column are electrically connected to a single SA. In other embodiments, different groups of SRAM cells 10 in a same column may be electrically connected to different SAs. For example, FIG. 4B illustrates SRAM cells in rows 1 through n being electrically connected to local SAs 250A while SRAM cells in rows n+1 through n+n being electrically connected to local SAs 250B. SAs 250A and 250B are in turn electrically connected to global SAs 252, which amplifies signals in each column of SRAM array 200. Thus, various embodiments may be applied to SRAM arrays having single stage SAs as well as multiple stage SAs.

Referring back to FIG. 4A, SRAM array 200 further includes a column of tracking cells 50 (labeled 50A and 50B), which may be used to detect the process corners of SRAM cells 10 for improved SA timing. For example, due to variations resulting from manufacturing processes used to form SRAM cells 10, SRAM cells 10 may operate slower or faster particularly in different operating environments (e.g., different temperatures, voltages, and/or the like). Tracking cells 50 may be included in SRAM array 200 in order track the timing effects of such process corners as explained in greater detail in subsequent paragraphs. The RBL of tracking cells 50 (referred to hereinafter as a tracking BL 210) is electrically connected to a read SA timer control circuit 204, which adjusts read SA timing based on detected timing variations during SRAM operations. For example, when a slow corner is detected, read SA timer control circuit 204 may extend the clock cycle of a read SA accordingly. Because SRAM tracking cells 50 are integrated as part of SRAM array 200 (as opposed to being disposed in a separate area of a die than SRAM array 200), improved accuracy in process corner tracking has been observed. Furthermore, because SRAM tracking cells 50 are embedded within SRAM array 200, a smaller overall footprint can be achieved compared to dies having separately deployed SRAM tracking cells and SRAM cells. Thus, various embodiments provide robust and lower area penalty tracking cells 50 for SA timing configuration.

SRAM tracking cells 50 are disposed adjacent a column of SRAM tracking read pass-gate control cells 52 (labeled 52A and 52B). As explained in greater detail below, SRAM tracking read pass-gate control cells 52 may be used to either enable or disable the read pass-gate transistors of SRAM tracking cells 50. When the read pass-gate transistor of an SRAM tracking cell 50 is enabled, the SRAM tracking cell 50 may be used to track read current ($I_{Read}$) as explained in greater detail below. In FIG. 4A, SRAM tracking cells having enabled read pass-gate transistors are designated as 50A (referred to hereinafter as SRAM read current racking cells 50A), and a positive power supply voltage Vdd may be applied to gates of such read pass-gate transistors through adjacent SRAM tracking read pass-gate control cells 52A at appropriate intervals.

When the read pass-gate transistor of an SRAM tracking cell 50 is disabled, the SRAM tracking cell 50 may be used to track RBL capacitance as explained in greater detail below. In FIG. 4A, SRAM tracking cells having disabled read pass-gate control transistors are designated as 50B (referred to hereinafter as SRAM read capacitance tracking cells 50B), and gates of such read pass-gate transistors are connected ground voltage Vss by adjacent SRAM tracking read pass-gate control cells 52B.

In some embodiments, SRAM tracking read pass-gate control cells 52 may optionally include a portion of a Vss line 216, which when combined with other SRAM tracking read pass-gate control cells 52 in the column forms a continuous conductive line (e.g., Vss line 216). In some embodiments, a source/drain of a read pull-down transistor of SRAM tracking cell 50 may be electrically coupled to Vss line 216. In other embodiments, Vss line 216 may be omitted.

In various embodiments, tracking cells 50 track both RBL current and capacitance for improved accuracy. This is because SRAM cell 10 delay timing is a function of: CV/I where V is voltage applied to the read port; C is capacitance of the read port, and I is read port current. By enabling as well as disabling certain SRAM tracking cells 50 in SRAM array 200, the effects of process corners on both read port current and read port capacitance can be accounted for, which may result in more accurate SA timing matching.

Figure 4C:
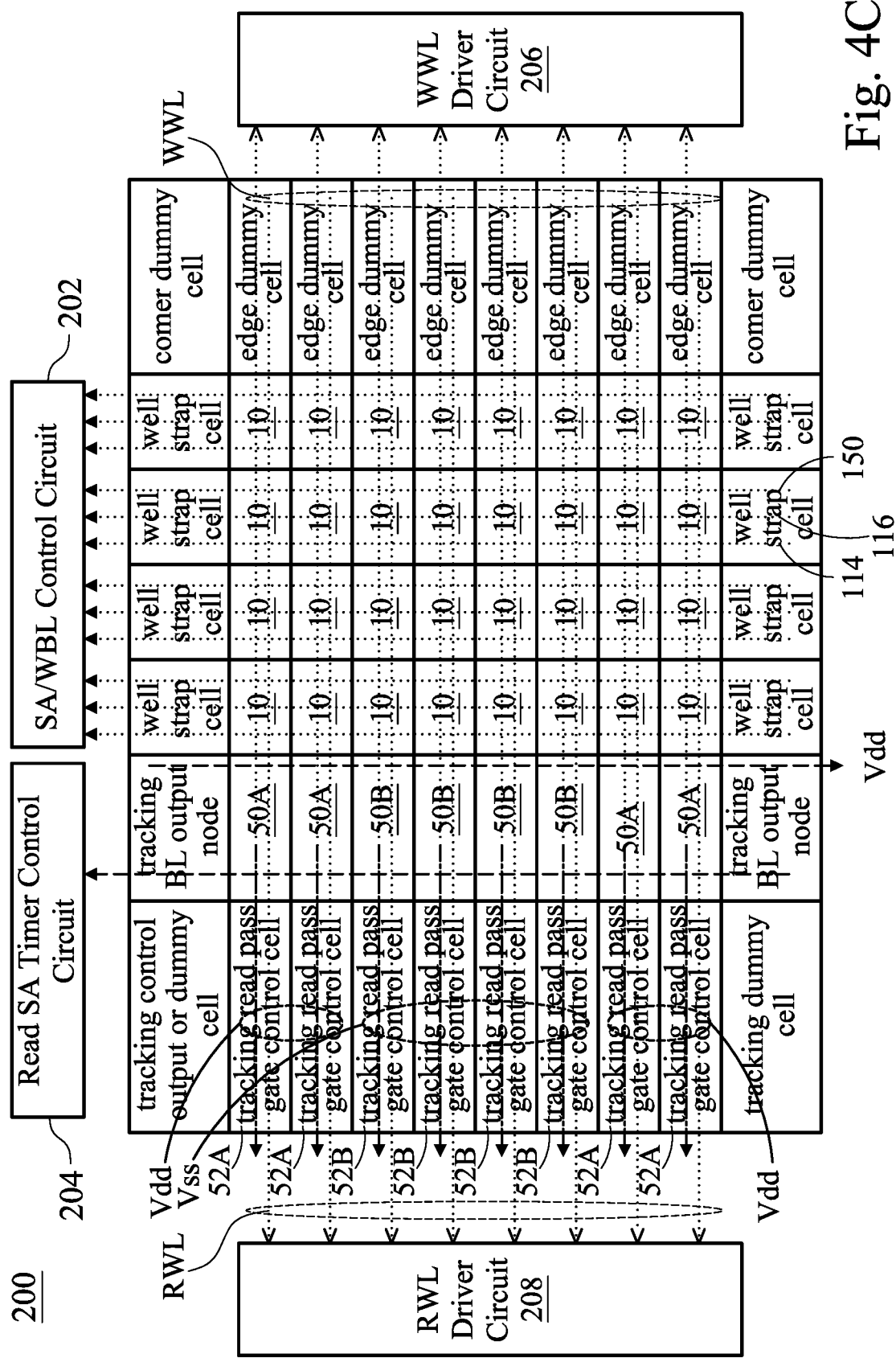

In SRAM array 200, half of SRAM tracking cells 50 are SRAM read current tracking cells 50A while the other half of the SRAM tracking cells 50 are SRAM read capacitance tracking cells 50B. Other embodiments may include a different allocation of SRAM read current tracking cells 50A and SRAM read capacitance tracking cells 50B. For example, an embodiment SRAM array 200 may include only SRAM read current tracking cells 50A. Furthermore, in SRAM array 200, all SRAM read current tracking cells 50A are grouped together while all SRAM read capacitance tracking cells 50B are grouped together. In other embodiments, other configurations may be used. For example, FIG. 4C illustrates an embodiment SRAM array having SRAM read capacitance tracking cells 50B disposed between rows of SRAM read current tracking cells 50A.

As further illustrated by FIG. 4A, SRAM cells 10 in a same row share a common WWL and RWL. For example, each SRAM cell 10 in a same row includes a portion of a WWL and a RWL, which when combined with other SRAM cells 10 in the row forms continuous conductive lines (e.g., the WWL and RWL). The WWLs and RWLs are electrically to WWL driver circuitry 206 and RWL driver circuitry 208, respectively. WWL driver circuitry 206 may be used to select a particular row in SRAM array 200 for write operations. Similarly, RWL driver circuitry 208 may be used to select a particular row in SRAM array 200 for read operations.

Figure 5A:
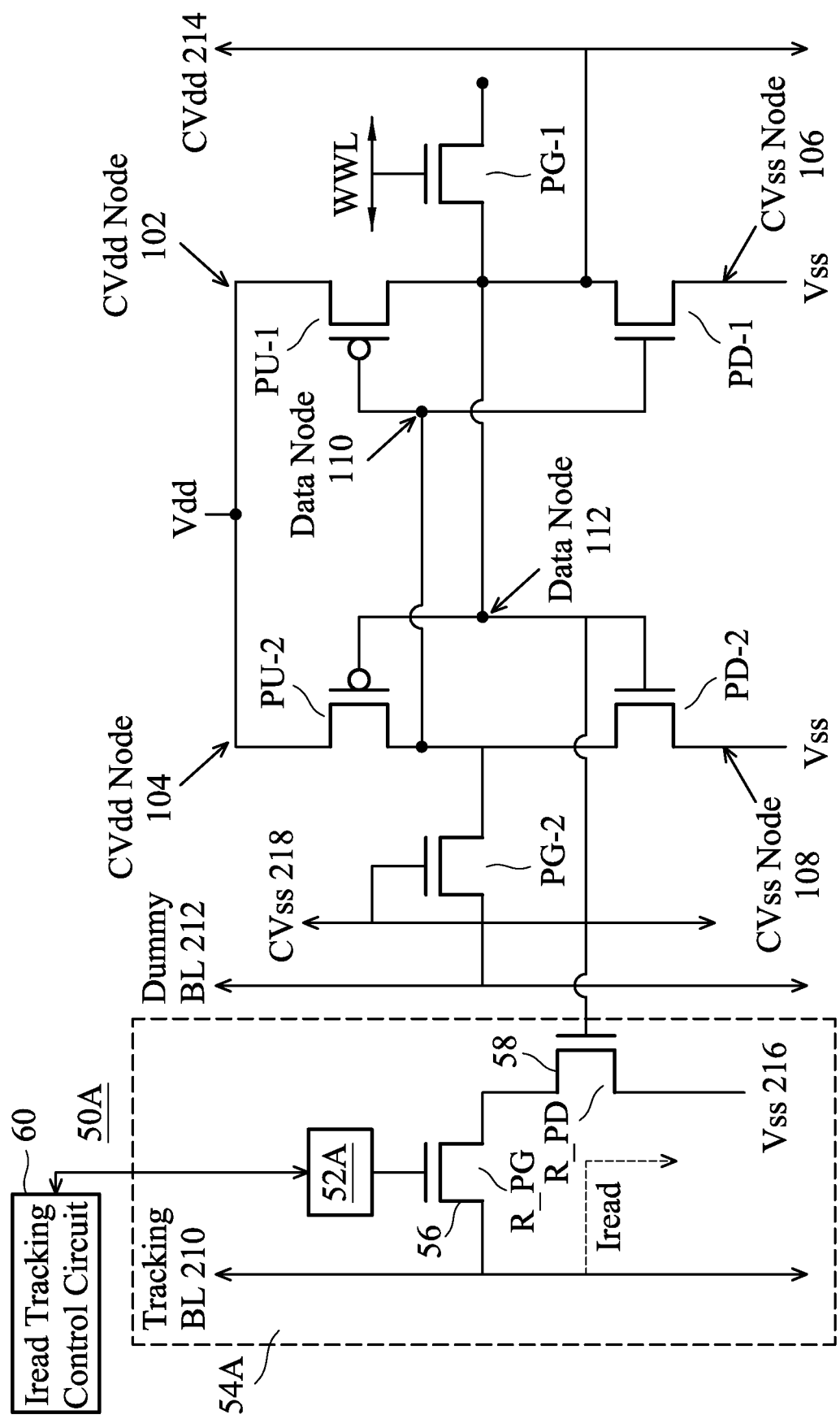
FIGS. 5A through 5C illustrate circuit diagrams of SRAM tracking cells in accordance with some embodiments.
Figure 5B:
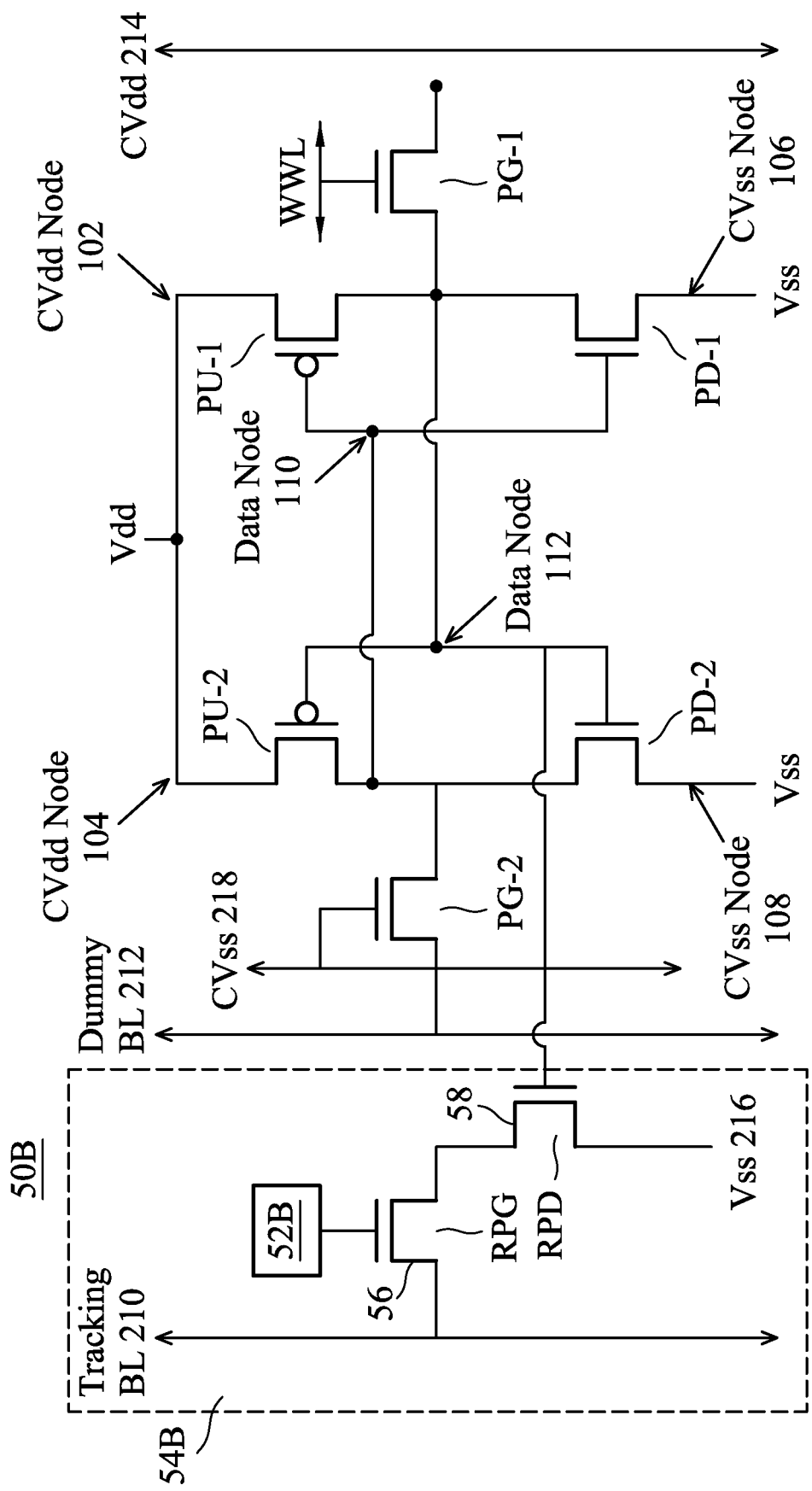

FIGS. 5A and 5B illustrate circuit diagrams of SRAM tracking cells 50. FIG. 5A illustrates a circuit diagram of an SRAM read current tracking cells 50A while FIG. 5B illustrates a circuit diagram of an SRAM read capacitance tracking cells 50B. SRAM tracking cells 50 may have include similar features as SRAM cells 10 where like reference numerals indicate like elements. For example, each SRAM tracking cell 50 includes a pair of cross-coupled inverters with a first inverter provided by transistors PU-1/PD-2 and a second inverter provided by transistors PU-2/PD-2. Differences between SRAM tracking cells 50 and SRAM cells 10 are explained below.

SRAM read current tracking cells 50A and SRAM read capacitance tracking cells 50B are dummy cells in that SRAM read current tracking cells 50A and SRAM read capacitance tracking cells 50B are not used to store any data. In some embodiments, SRAM tracking cells 50 are permanently deselected from write operations. For example, gates of one or more of the write pass gate transistors PG-1/PG-2 may be directly connected to ground through a Vss line 218. A single Vss line 218 may be shared by all SRAM tracking cells 50. For example, each SRAM tracking cell 50 includes a portion of Vss line 218, which when combined with other SRAM tracking cells 50A/50B in the column forms a continuous Vss line 218 (see also FIG. 4A). Source/drains of pass-gate transistors PG-1 and/or PG-2 may or may not be electrically connected to a dummy write bit line 212. Dummy write bit line 212 is referred to as a "dummy" bit line because it is not used to select the SRAM tracking cell 50 for write or read operations. In some embodiments, each SRAM tracking cell 50 includes a portion of dummy write bit line 212, which when combined with other SRAM tracking cells 50 in the column forms a continuous dummy write bit line 212 (see also FIG. 4A). Dummy write BL 212 may be substantially parallel to Vss line 218. In other embodiments, dummy write BL 212 may be excluded.

Figure 5C:
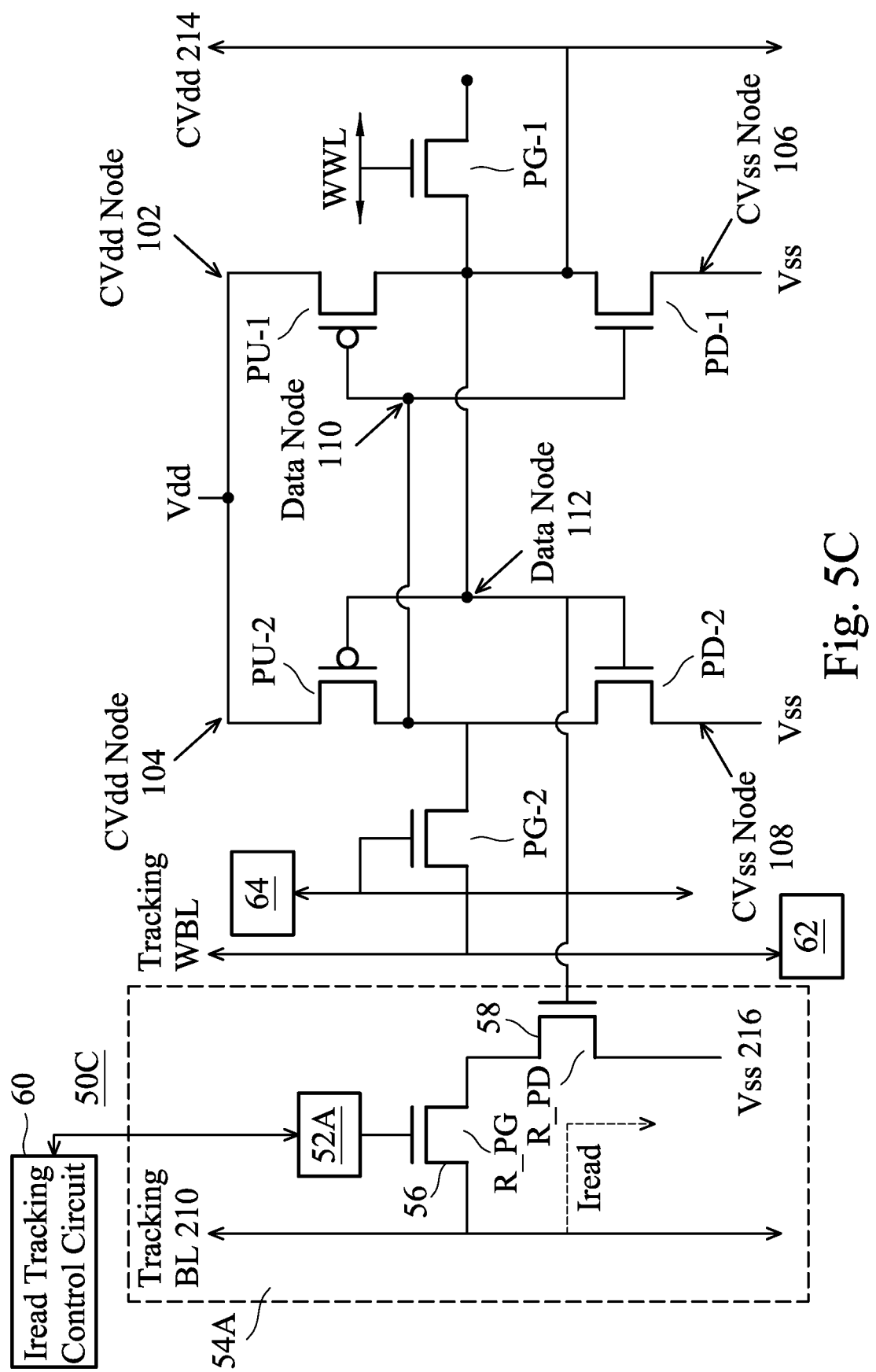

In yet other embodiments, dummy write BL 212 (in both types of tracking cells 50A and 50B) may be replaced with a tracking WBL (see e.g., FIG. 5C), which may be used to automatically extend a write SA clock cycle in accordance with detected write port timing. In such embodiments, a write current ($I_{write}$) tracking control circuit 62 may be connected to a gate of pass-gate transistor PG-2, and SD node 110 may be coupled to electrical ground voltage (or other predetermined voltage). During write operations in an SRAM array, the tracking WBL may be pre-charged to positive supply voltage. After the tracking WBL is charged, $I_{write}$ current tracking control circuit 62 may apply a positive supply voltage (e.g., Vdd) to a gate of read pass-gate transistor PG-2. The tracking WBL is connected to a write SA timer control circuit 64, which detects the length of time taken by the tracking WBL to discharge through pass-gate transistor PG-2. Depending on the discharge time of tracking WBL, write SA timer control circuit 64 may extend a clock cycle of a write SA accordingly. An embodiment SRAM array may further include SRAM write capacitance tracking cells where a gate of pass-gate transistor PG-2 is directly connected to a CVss line.

Referring first to FIG. 5A, SRAM read current tracking cell 50A includes a read port 54A for tracking the effects of process corners on read port timing in an SRAM array incorporating SRAM tracking cells 50 (e.g., SRAM array 200, see FIG. 4A). Read port 54A includes a read pass-gate transistor 56 and a read pull-down transistor 58, which may correspond to read pass-gate transistor R_PG-1 and read pull-down transistor R_PD-1 of SRAM cell 10. A gate of read pull-down transistor is electrically connected to SD node 112. Read pull-down transistor 58 may be permanently enabled, for example, by directly connecting SD node 112 to positive power supply line 214. In various embodiments, positive power supply line 214 may replace WBLs 114 of SRAM cells 10. For example, each SRAM tracking cell 50 includes a portion of positive power supply line 214, which when combined with other SRAM tracking cells 50 in the column forms a continuous positive power supply line 214 (see also FIG. 4A). As further illustrated by FIG. 5A, source/drain regions of write pass-gate transistor PG-1 may be electrically disconnected from positive power supply line 214.

Figure 11:
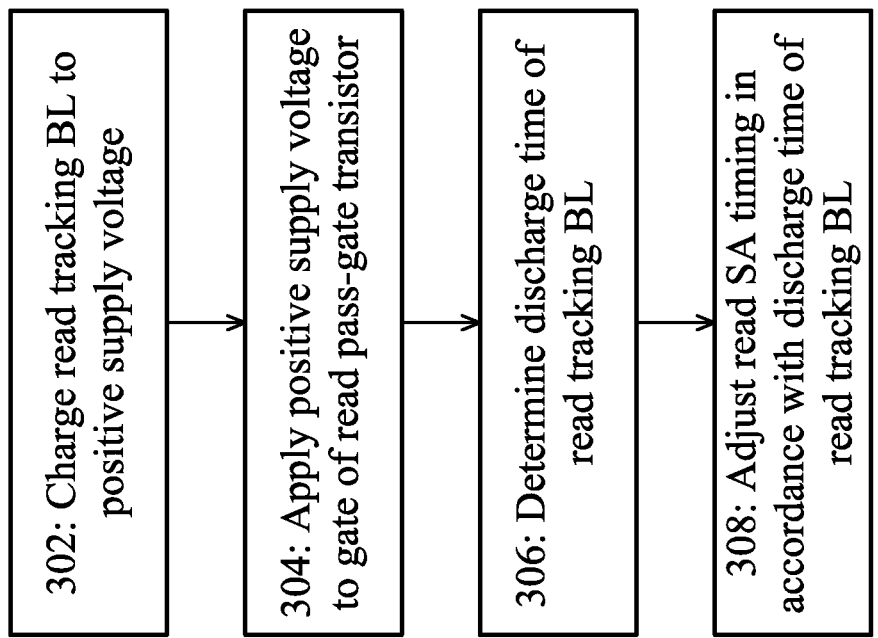
FIG. 11 illustrates a process flow of an embodiment sense amplifier timer control circuit.

During read operations in SRAM array 200, tracking BL 210 is pre-charged (step 302 of FIG. 11) to positive supply voltage (e.g., Vdd or another predetermined value) by a read SA timer control circuit (e.g., circuit 204, see FIG. 4A). After tracking BL 210 is charged, positive supply voltage is applied to the gate of read pass-gate transistor 56 (step 304 of FIG. 11) by an $I_{read}$ tracking control circuit 60, for example, through SRAM tracking read pass-gate control cell 52A. $I_{read}$ tracking control circuit 60 may include any suitable circuitry to selectively apply positive supply voltage to the gate of RPG transistor 56 during read operations in SRAM array 200. In some embodiments, $I_{read}$ tracking control circuit 60 may be deployed as part the read SA timer control circuit. In other embodiments, $I_{read}$ tracking control circuit 60 may be deployed separately from the read SA timer control circuit.

Because positive supply voltage is applied to the gates of both read pass-gate transistor 56 and read pull-down transistor 58, a current $I_{read}$ will run through read pass-gate transistor 56 and read pull-down transistor 58. Current $I_{read}$ discharges tracking BL 210 to voltage Vss (e.g., electrical ground). As explained above, tracking BL 210 is electrically connected to the read SA timer control circuit, which may detect how long tracking BL 210 takes to discharge to ground (see step 306 of FIG. 11). The read SA timer control circuit may automatically adjust the read SA clock cycle in accordance with the length of time taken by tracking BL 210 discharge (see step 308 of FIG. 11).

Referring next to FIG. 5B, SRAM read capacitance tracking cell 50B includes a read port 54B for tracking the effects of process corners on read port timing in an SRAM array incorporating SRAM tracking cells 50 (e.g., SRAM array 200, see FIG. 4A). Similar to read port 54A, read port 54B also includes a read pass-gate transistor 56 and a read pull-down transistor 58. A gate of read pull-down transistor 58 is electrically connected to SD node 112. However, read pull-down transistor 58 may not be permanently selected because SD node 112 may not be electrically connected to positive power supply line 214. In other embodiments, read pull-down transistor 58 may be permanently selected by directly connect SD node 112 to positive power supply line 214. Because SRAM tracking cells 50A and 50B may be deployed in a same column, a single positive power supply line 214 may be shared by both types of SRAM tracking cells 50A and 50B. As further illustrated by FIG. 5B, source/drain regions of write pass-gate transistor PG-1 are electrically disconnected from positive power supply line 214.

During read operations in SRAM array 200, tracking BL 210 is pre-charged to positive supply voltage (e.g., Vdd or another predetermined value) as discussed above. Because SRAM tracking cells 50A and 50B may be deployed in a same column, a single tracking BL 210 may be shared by both types of SRAM tracking cells 50A and 50B. For example, portions of tracking BL 210 may be disposed in different SRAM tracking cells 50A and 50B. However, unlike SRAM read current tracking cell 50A, SRAM read capacitance tracking cell 50B does not serve to discharge tracking BL 210. For example, a voltage Vss (e.g., electrical ground or other predetermined voltage) is applied to the gate of read pass-gate transistor 56 by SRAM tracking read pass-gate control cell 52B. Thus, read pass-gate transistor 56 operates as an open switch, and $I_{read}$ does not flow through read pass-gate transistor 56 or read pull-down transistor 58. As explained above, process corner timing is a function of both $I_{read}$ current and read port capacitance. Thus, by having SRAM read capacitance tracking cell 50B electrically connected to tracking BL 210, tracking BL 210 may more accurately mimic the timing of functional RBLs 150 in SRAM array 200 (see e.g., FIG. 4A).

FIGS. 6A through 6D illustrate block diagrams of a layout of features of a writable memory cell (e.g., SRAM cell 10) according to some embodiments. FIGS. 6A through 6D illustrates features in different levels of SRAM cell 10 (e.g., OD level, contact level, via_0 level, M1 level, via-1 level, M2 level, see FIG. 3), which are consecutively described for clarity.

Figure 6A:
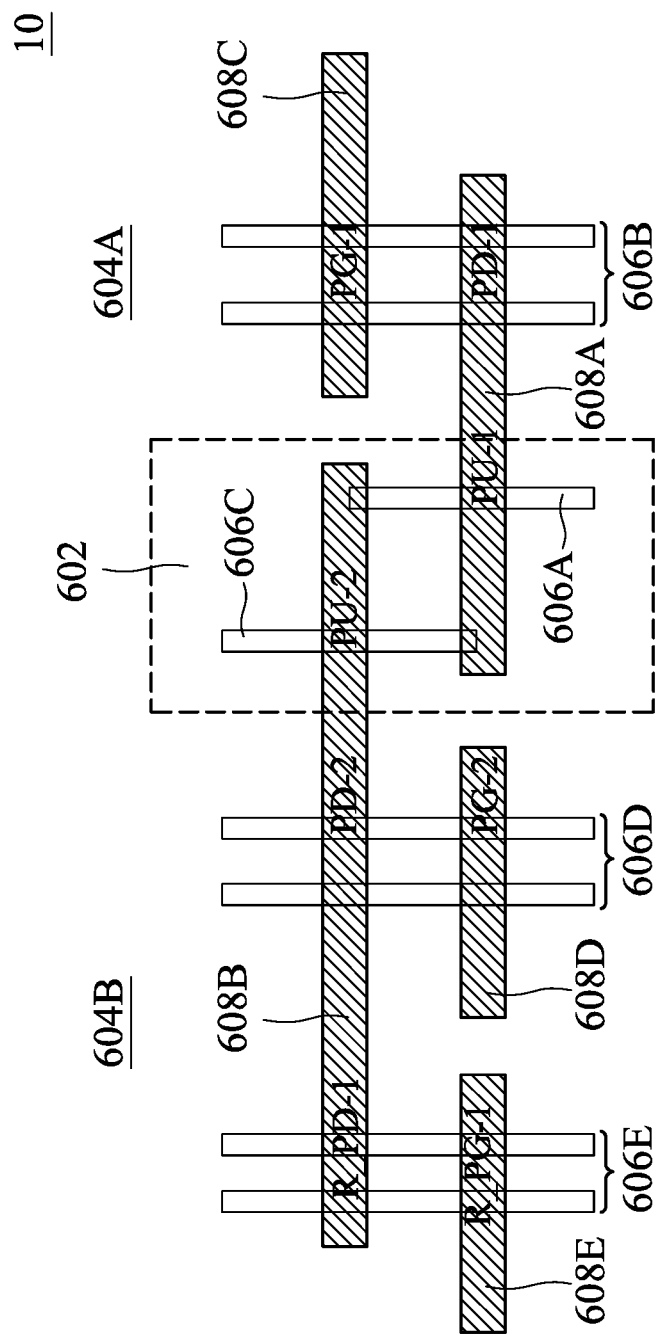
FIGS. 6A through 6E illustrate block diagrams of SRAM cell layouts in accordance with some embodiments.

Referring first to FIG. 6A, features in the OD level (FIG. 3) and overlying gate electrodes of various transistors in SRAM cell 10 are illustrated. An n-well region 602 is at the middle of SRAM cell 10, and two p-well regions 604A and 604B are on opposite sides of n-well region 602. Gate electrode 608A forms pull-up transistor PU-1 with an underlying active region 606A in n-well region 602. In an embodiment, active region 606A is fin-based and includes one or more fin structures disposed under gate electrode 608A (e.g., gate electrode 608A may be disposed over and extend along sidewalls of active region 606A). Gate electrode 608A further forms pull-down transistor PD-1 with underlying active region 606B in p-well region 604A (e.g., on a first side of n-well region 602). In an embodiment, active region 606B is fin-based and includes one or more continuous fin structures disposed under gate electrode 608A (e.g., gate electrode 608A may be disposed over and extend along sidewalls of active region 606B). Gate electrode 608C forms pass-gate transistor PG-1 with active region 606B. In an embodiment, gate electrode 608C is disposed over and extends along sidewalls of active region 606B

As further illustrated by FIG. 6A, gate electrode 608B forms pull-up transistor PU-2 with an underlying active region 606C in n-well region 602. In an embodiment, active region 606C is fin-based and includes one or more fin structures disposed under gate electrode 608B (e.g., gate electrode 608B may be disposed over and extend along sidewalls of active region 606C). Gate electrode 608B further forms pull-down transistor PD-2 with an underlying active region 606D in p-well region 604B (e.g., on a second side of n-well region 602 opposing p-well region 604A). Gate electrode 608B further forms read pull-down transistor R_PD-2 with an underlying active region 606E in p-well region 604B. In an embodiment, active regions 606D and 606E are fin-based and includes one or more fin structures disposed under gate electrode 608B (e.g., gate electrode 608B may be disposed over and extend along sidewalls of active regions 606D and 606E). Gate electrode 608D forms pass-gate transistor PG-2 with underlying active region 606D. In an embodiment, gate electrode 608D is disposed over and extends along sidewalls of active region 606D. Gate electrode 608E forms read pass-gate transistor R_PG-1 with underlying active region 606E. In an embodiment, gate electrode 608E is disposed over and extends along sidewalls of active region 606E.

In accordance with some embodiments of the present disclosure, pass-gate transistors PG-1, PG-2, and R_PG-1; pull-up transistors PU-1 and PU-2, and pull-down transistors PD-1, PD-2, and R_PD-1 are Fin Field-Effect Transistors (FinFETs) as described above where active regions 606A through 606E include one or more fin structures. In accordance with alternative embodiments of the present disclosure, one or more of the pass-gate transistors PG-1, PG-2, and R_PG-1; pull-up transistors PU-1 and PU-2, and pull-down transistors PD-1, PD-2, and R_PD-1 are planar MOS devices having active regions doped in an upper surface of a semiconductor substrate. Active regions 606 provide source/drain regions for various transistors on opposing sides of a respective gate electrode 608. FIG. 6A illustrates a single fin or dual fins for each active region 606A through 606E in accordance with some embodiments. In accordance with other embodiments, there may be a single fin, two fins, three fins, or more for each active region 606A through 606D, and the number of fins in each active region 606A through 606E may be the same or different as other active regions in SRAM cell 10.

In the FinFET embodiments, the fins may be formed in various different processes. In one example, the fins can be formed by etching trenches in a substrate to form semiconductor strips; the trenches can be filled with a dielectric layer; and the dielectric layer can be recessed such that the semiconductor strips protrude from the dielectric layer to form fins. In another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form fins. In still another example, heteroepitaxial structures can be used for the fins. For example, the semiconductor strips can be recessed, and a material different from the semiconductor strips may be epitaxially grown in their place. In an even further example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

The formation of gate electrodes 608A through 608E may include forming a dielectric layer, such as silicon dioxide, may be formed over the semiconductor substrate. The gate dielectric layer (not shown) may be formed by thermal oxidation, chemical vapor deposition (CVD), sputtering, or any other methods known and used in the art for forming a gate dielectric. In some embodiments, the gate dielectric layer includes dielectric materials having a high dielectric constant (k value), for example, greater than 3.9. The gate dielectric materials include silicon nitrides, oxynitrides, metal oxides such as $HfO_2$, $HfZrO_x$, $HfSiO_x$, $HfTiO_x$, $HfAlO_x$, the like, or combinations and multi-layers thereof.

After the formation of the gate dielectric layer, a gate electrode layer is formed over the gate dielectric layer. This gate electrode layer may include a conductive material and may be selected from a group comprising polycrystalline-silicon (polysilicon), poly-crystalline silicon-germanium (poly-SiGe), metallic nitrides, metallic silicides, metallic oxides, and metals. The gate electrode layer may be deposited by physical vapor deposition (PVD), CVD, sputter deposition, or other techniques known and used in the art for depositing conductive materials. After deposition, a top surface of the gate electrode layer usually has a non-planar top surface, and may be planarized, for example, by a chemical mechanical polishing (CMP) process, prior to patterning of the dummy gate electrode layer or gate etch. Ions may or may not be introduced into the gate electrode layer at this point. Ions may be introduced, for example, by ion implantation techniques. If polysilicon is used, in subsequent steps the gate electrode may be reacted with metal to form a silicide to reduce contact resistance. The gate dielectric layer and the gate electrode layer are then etched such that the layers remain on active regions 306 to form gate electrodes. Similarly, if FinFETs are used, gate structures 308 will be formed over and around the active regions 302. Dielectric spacers may be formed along the edges of the gate electrodes, and the gate electrodes may be doped as desired.

After the gates are formed, the source and drain regions for the transistors may be formed. This may involve doping the active regions on either side of the gate for each transistor to provide source/drain regions. Different resist layers may be needed when doping transistors with p-type dopants and when doping transistors with n-type dopants.

Figure 6B:
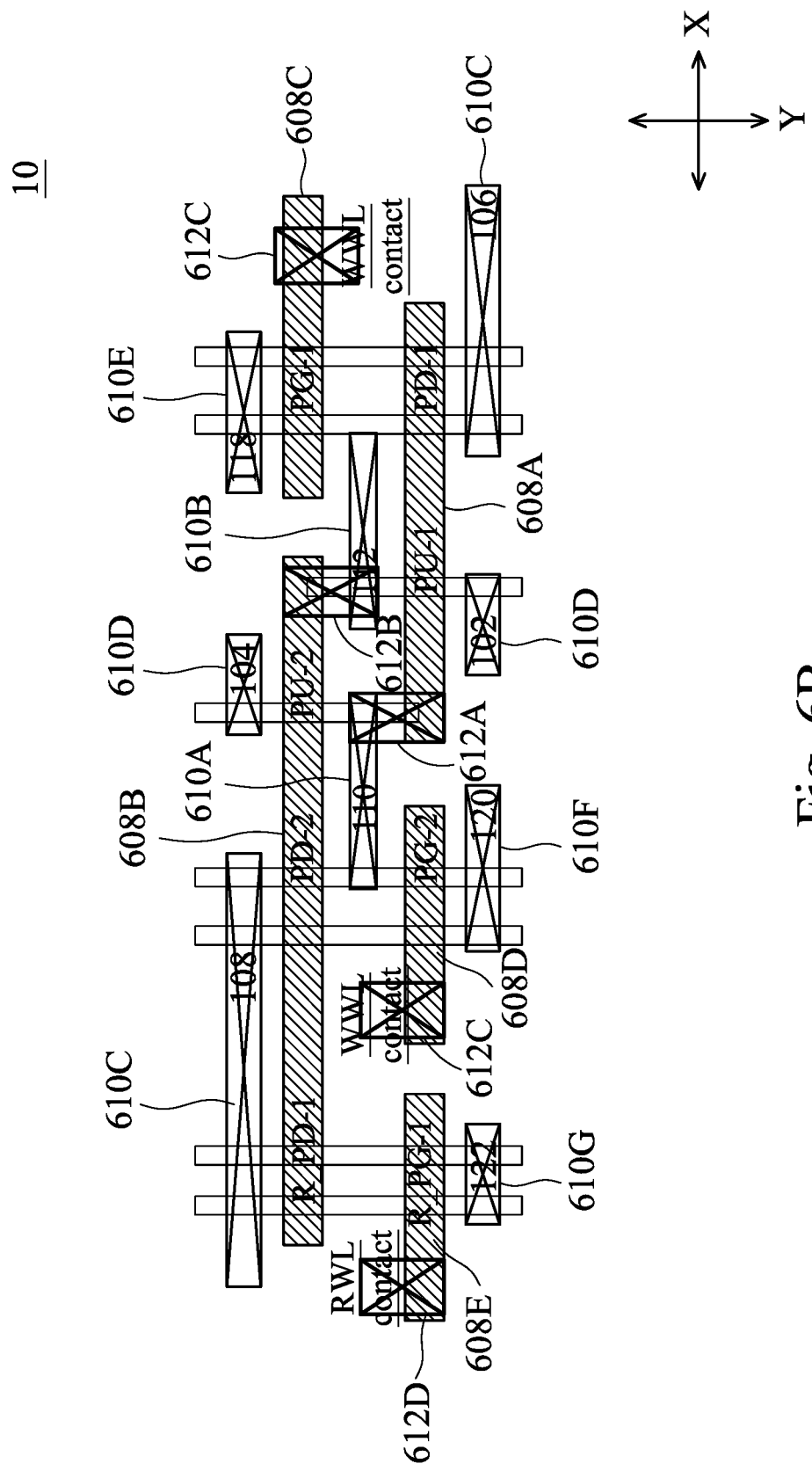

FIG. 6B illustrates features of SRAM cell 10 in the contact level (see FIG. 3) and lower. As shown in FIG. 6B, SD node 110 (see also FIG. 1) includes source/drain contact plug 610A and gate contact plug 612A, which are the features at the contact level of SRAM cell 10 (see FIG. 3). Source/drain contact plug 610A is elongated and has a longitudinal direction in the X direction, which is parallel to the extending directions of gate electrodes 608A and 608B. Gate contact plug 612A comprises a portion over, and is electrically connected to, gate electrode 608A. In accordance with some embodiments of the present disclosure, gate contact plug 612A has a longitudinal direction in the Y direction, with is perpendicular to the X direction. In the manufacturing of the SRAM cell 10 on physical semiconductor wafers, contact plugs 610A and 612A may be formed as a single continuous butted contact plug.

SD node 112 includes source/drain contact plug 610B and gate contact plug 612B. Gate contact plug 612B has a portion overlapping source/drain contact plug 610B. Since SD node 110 may be symmetric to SD node 112, the details of gate contact plug 612B and source/drain contact plug 610B may be similar to gate contact plug 612A and source/drain contact plug 610A, respectively.

FIG. 6B also illustrates gate contacts 612C connected to gate electrodes 608C and 608D, which may be used to electrically connect gate electrodes 608C and 608D to one or more WWLs as described in greater detail below. SRAM cells 10 also include gate contacts 612D connected to gate electrodes 608E, which may be used to electrically connect gate electrode 608E to a RWL as described in greater detail below.

Furthermore, elongated contact plugs 610C are used to connect to the source regions of pull-down transistors PD-1, PD-2, and R_PD-1 to CVss lines (e.g., electrical ground lines). In some embodiments, source regions of pull-down transistors PD-2 and R_PD-1 may be share a single contact plug 610C. Elongated contact plugs 610C are parts of the CVss nodes 106 and 108 (see also FIG. 1). Elongated contact plugs 610C have lengthwise directions parallel to the X direction, and may be formed to overlap the corners of SRAM cell 10. Furthermore, elongated contact plugs 610C may further extend into neighboring SRAM cells in a different column that abut SRAM cell 10 (see FIG. 6E). Elongated contact plugs 610C may further be shared between two neighboring SRAM cells in different rows that abut each other (see FIG. 6E).

Additionally, contact plugs 610D connect to the source regions of pull-up transistors PU-1 and PU-2 to CVdd lines (e.g., supply voltage lines). Contact plugs 610D are parts of the CVdd nodes 102 and 104 (see also FIG. 1). Contact plugs 610D may further be shared between two neighboring SRAM cells in different rows that abut each other (see FIG. 6E).

Figure 6C:
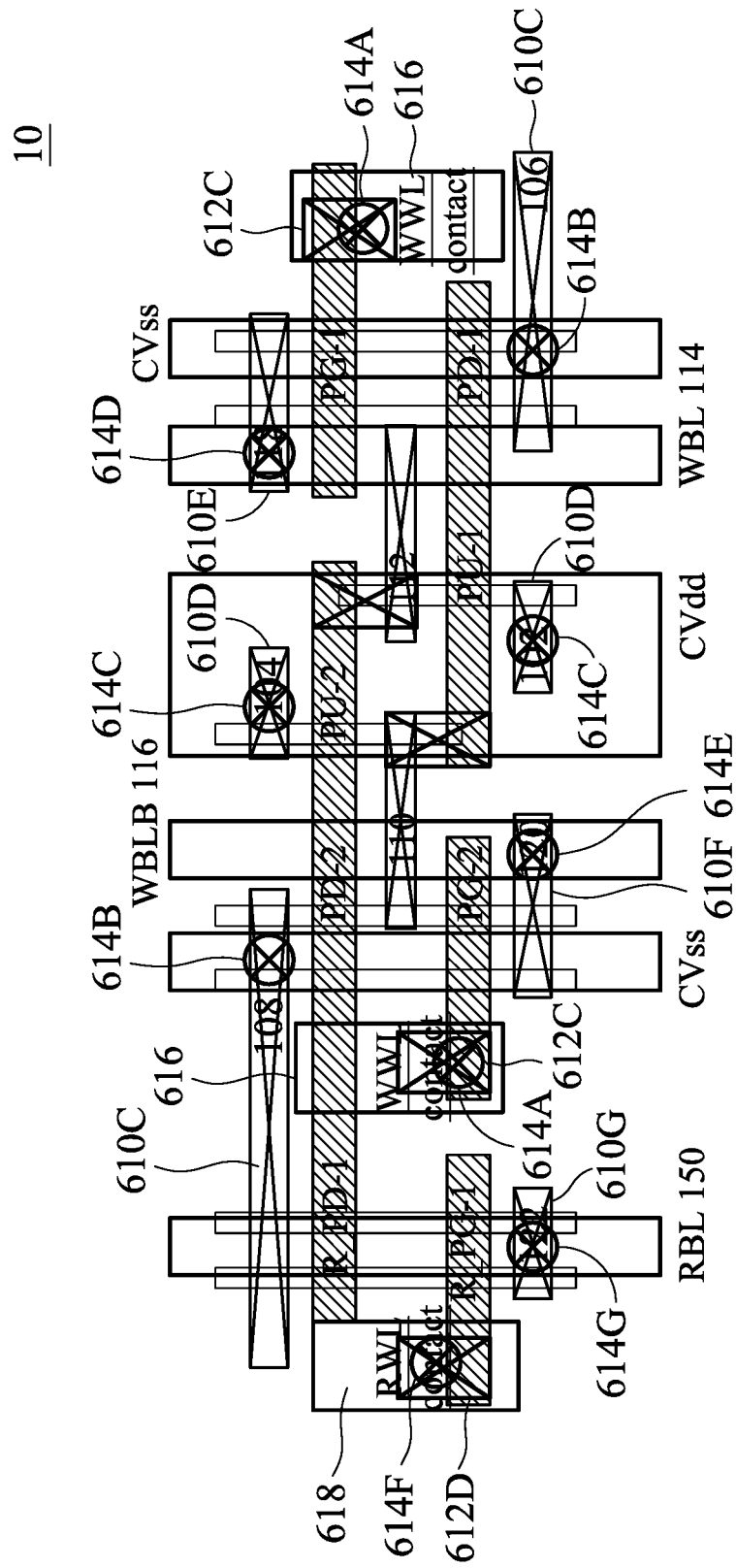

As further illustrated by FIG. 6B, contact plugs 610E and 610F are used to connect the source/drain regions of pass-gate transistors PG-1 and PG-2 to a WBL 114 and a WBLB 116, respectively (see FIG. 6C). Contact plugs 610E and 610F are parts of the WBL node 118 and WBLB node 120, respectively (see FIG. 1). Contact plug 610G is used to connect a source/drain region of read pass-gate transistor R_PG-1 to RBL 150 (see FIG. 6C), and contact plug 610G is part of a RBL node 122 (see FIG. 1). Contact plugs 610E, 610F and 610G may further be shared between two neighboring SRAM cells in different rows that abut each other (see FIG. 6E).

FIG. 6C illustrates features of SRAM cell 10 in the M1 and via_0 levels (see FIG. 3) and lower. In FIG. 6C, vias 614 (labeled 614A through 614G) are disposed in the via_0 level (see FIG. 3) while conductive lines 616, conductive lines 618, WBL 114, CVdd lines, CVss lines, and WBLB line 116 are disposed in the M1 level (see FIG. 3). For example, various conductive lines in the M1 level are disposed over various vias in the via_0 level.

As shown in FIG. 6C, vias 614A are connected to gate contacts 612C (e.g., gate contacts for pass-gate transistors PG-1 of PG-2). Vias 614A are further connected to conductive lines 616, which may be used to electrically couple gate electrodes of pass gate transistors PG-1 and PG2 to one or more WWLs as described in greater detail with respect to FIG. 6D below. Vias 614A and conductive lines 616 may further extend into and are shared with neighboring SRAM cells in a different column that abut SRAM cell 10 (see FIG. 6E).

Vias 614B are connected to elongated contact plugs 610C (e.g., source contacts of pull-down transistors PD-1, PD-2, R_PD-1). Vias 614B are further connected to CVss lines and may be used to electrically couple sources of pull-down transistors PD-1, PD2, and R_PD-1 to Vss voltage. Furthermore, vias 614B may further extend into neighboring SRAM cells in a different column that abut SRAM cell 10. Vias 614B may further be shared between two neighboring SRAM cells in different rows that abut each other (see FIG. 6E). In an embodiment, one or more continuous CVss lines are shared by all SRAM cells in a same column within an SRAM array.

Additionally, vias 614C are connected to contact plugs 610D (e.g., source contacts of pull-up transistors PU-1 and PU-2). Vias 614C are further connected to a CVdd line, which electrically connects sources of pull-up transistors PU-1 and PU-2 to CVdd. Thus, vias 614C are parts of the CVdd nodes 102 and 104 (see also FIG. 1). Vias 614C may further be shared between two neighboring SRAM cells in different rows that abut each other (see FIG. 6E). In an embodiment, a single, continuous CVdd line is shared by all SRAM cells in a same column of the SRAM array.

As further illustrated by FIG. 6C, vias 614D and 614E are connected to contact plugs 610E and 610F (e.g., source/drain contacts of pass-gate transistors PG-1 and PG-2), respectively. Vias 614D and 614E are further connected to a WBL 114 and a WBLB 116, respectively. Via 614G is further connected to a RBL 150. Thus, vias 614D and 614E are parts of WBL node 118 and WBLB node 120, respectively (see also FIG. 1). Vias 614D and 614E may be shared between two neighboring SRAM cells in different rows that abut each other (see FIG. 6E). Furthermore, as described above, SRAM cells in a same column share a continuous WBL and a continuous WBLB.

Via 614F is connected to gate contact 612D (e.g., a gate contact for pass-gate transistors R_PG-1). Via 614F is further connected to conductive line 618, which may be used to electrically couple a gate electrode of pass gate transistor R_PG-1 to one or more RWLs as described in greater detail with respect to FIG. 6D below. Via 614F and conductive line 618 may further extend into and are shared with neighboring SRAM cells in a different column that abut SRAM cell 10 (see FIG. 6E).

Via 614G is connected to contact plug 610G (e.g., source/drain contact of read pass-gate transistor R_PG-1). Thus, via 614G is part of RBL node 122 (see also FIG. 1). Via 614G may be shared between two neighboring SRAM cells in different rows that abut each other (see FIG. 6E). Furthermore, as described above, SRAM cells in a same column share a continuous RBL 150.

Figure 6D:
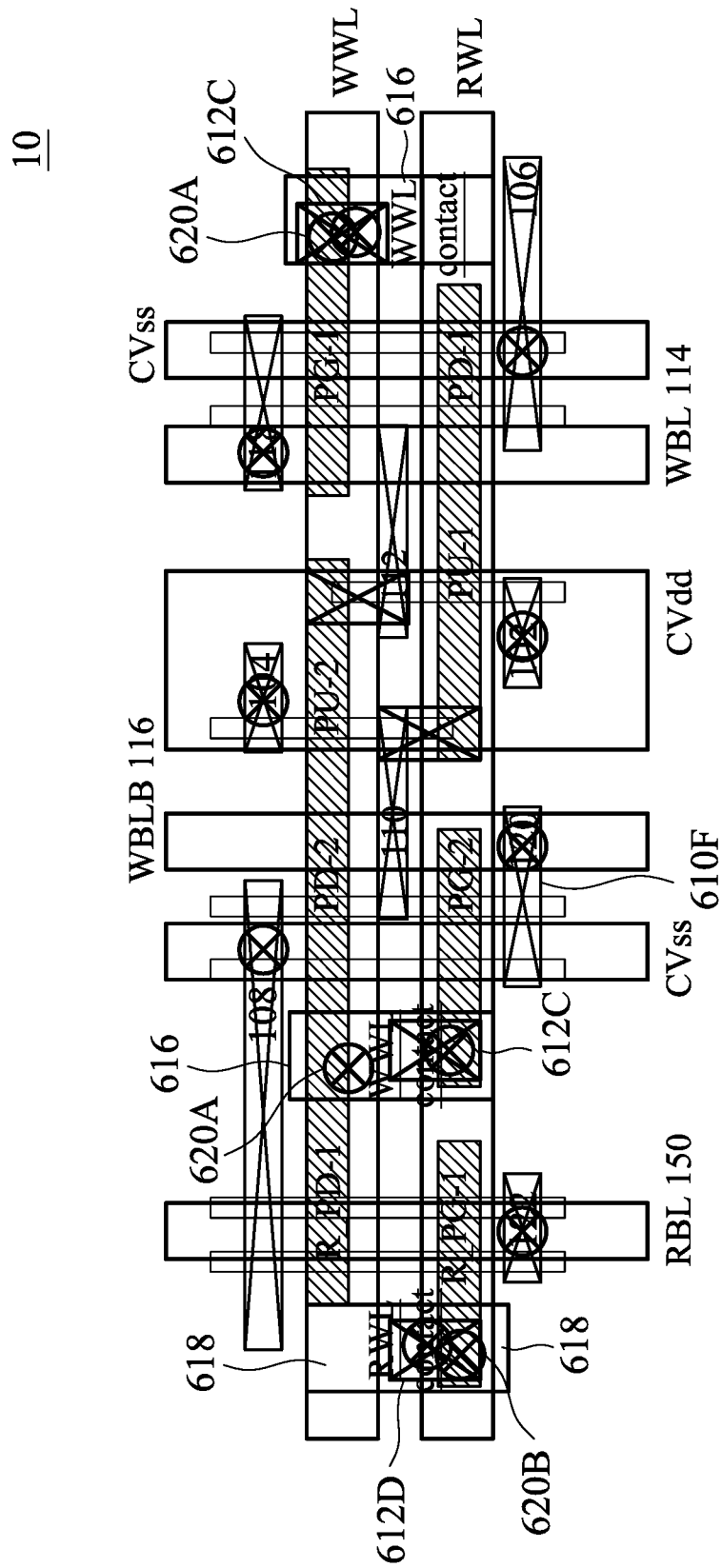

FIG. 6D illustrates features of SRAM cell 10 in the M2 and via_1 levels (see FIG. 3) and lower. In FIG. 6D, vias 620 (labeled 620A and 620B) are disposed in the via_1 level (see FIG. 3) while the WWL and the RWL are disposed in the M2 level (see FIG. 3). For example, various conductive lines in the M2 level are disposed over various vias in the via_1 level.

As shown in FIG. 6D, vias 620A are connected to conductive lines 616, which connect gate contacts 612C (e.g., gate contacts for pass-gate transistors PG-1 of PG-2) to a WWL. Thus, SRAM cell 10 includes WWL nodes electrically connected to gates of write pass-gate transistors. In an embodiment, SRAM cells in a same row share a common, continuous WWL, which is used to select or deselect SRAM cells in an array for write operations. For example, in order to select a particular SRAM cell for write operations, a positive supply voltage may be applied to a WBL/WBLB as well as a WWL corresponding to the SRAM cell. WWL nodes may extend into and be shared with neighboring SRAM cells in a different column that abut SRAM cell 10 (see FIG. 6E).

Furthermore, vias 620B are connected to conductive line 618, which connects gate contacts 612D (e.g., gate contact for pass-gate transistors R_PG-1) to a RWL. Thus, SRAM cell 10 includes a RWL node electrically connected to a gate of read pass-gate transistor R_PG-1. SRAM cells in a same row share a common, continuous RWL, which is used to select or deselect SRAM cells in an array for read operations. For example, in order to select a particular SRAM cell for read operations, a positive supply voltage may be applied to a RBL as well as a RWL corresponding to the SRAM cell. RWL nodes may extend into and be shared with neighboring SRAM cells in a different column that abut SRAM cell 10 (see FIG. 6E).

Figure 6E:
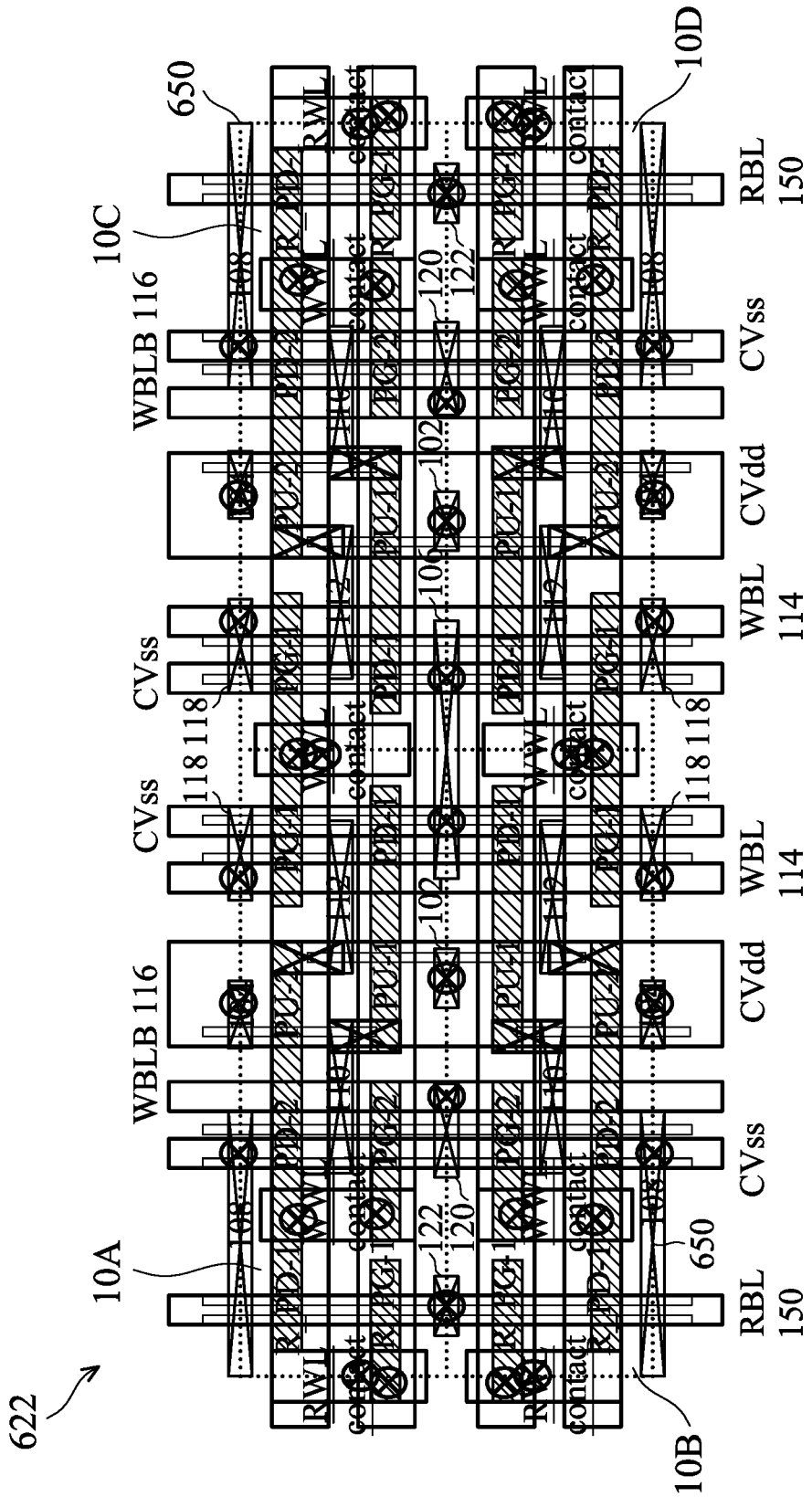

FIG. 6E illustrates multiple adjacent SRAM cells 10 (labeled SRAM cells 10A through 10D) arranged in a grid 622. In FIG. 6E, dotted lines 650 generally denote boundaries between SRAM cells. In various embodiments, the orientation of SRAM cells 10 may be varied to provide a grid 622 with improved symmetry and repeatability. In an embodiment, an SRAM array (e.g., SRAM array 200, see FIG. 4A) includes multiple adjacent grids 622 to provide a desired number of rows and columns of SRAM cells 10.

In an embodiment, grid 622 is a 2×2 grid having four SRAM cells 10A, 10B, 10C, and 10D, each of which having a different orientation. SRAM cell 10A has a same orientation as described above with respect to FIGS. 6A through 6D. SRAM cell 10B is disposed in a same column but a different row than SRAM cell 10A. SRAM cell 10B is a mirror image of SRAM cell 10A flipped vertically across a boundary in the X direction (e.g., in a direction along a lengthwise direction of a word line) between SRAM cells 10A and 10B. SRAM cell 10C is disposed in a same row but a different column than SRAM cell 10A. SRAM cell 10C is a mirror image of SRAM cell 10A flipped horizontally across a boundary in the Y direction (e.g., in a direction along a lengthwise direction of a bit line) between SRAM cells 10A and 10C. SRAM cell 10D is disposed in a same row as SRAM cell 10B and a same column as SRAM cell 10C. SRAM cell 10D is a mirror image of SRAM cell 10B flipped horizontally across a boundary in the Y direction (e.g., in a direction along a lengthwise direction of a bit line) between SRAM cells 10D and 10B. SRAM cell 10D is further a mirror image of SRAM cell 10C flipped vertically across a boundary in the X direction (e.g., in a direction along a lengthwise direction of a WL) between SRAM cells 10D and 10B.

Each SRAM cell 10A through 10D includes individual SD nodes 110 and 112, which store complementary bits. However, adjacent SRAM cells 10A through 10D may share nodes at boundaries between the adjacent SRAM cells 10A through 10D. For example, SRAM cells 10A and 10B share common WWL nodes (e.g., a WWL node of pass-gate transistors PG-1) and CVss nodes 106 with a respective adjacent SRAM cell 10C and 10D. SRAM cells 10A and 10B may further share a common gate electrode for pass-gate transistors PG-1 with a respective adjacent SRAM cell 10C and 10D. As another example, SRAM cells 10A and 10C share common CVss nodes 106, CVdd nodes 102, WBLB nodes 120, and RBL nodes 122 with a respective adjacent SRAM cell 10B and 10D.

Although not explicitly illustrated, each SRAM cell 10A through 10D may further share other features at a boundary between other adjacent SRAM cells (not illustrated) in SRAM array 200. For example, SRAM cells 10A may share a common RWL node (e.g., a RWL node of read pass-gate transistor R_PG-1), a common CVss node 108, and a common gate electrode for pass-gate transistors PG-2 with an adjacent SRAM cell in a same row and to the left of SRAM cell 10A (not explicitly illustrated). As another example, SRAM cells 10A may share a common CVss node 108, CVdd node 104, and WBL node 118 with an adjacent SRAM cell in a same column and above SRAM cell 10A (not explicitly illustrated).

The layout of grid 622 may be repeated to provide an SRAM array (e.g., SRAM array 200) of any desired size. As illustrated in FIG. 6E, SRAM cells 10 within in a same column share a continuous BL 114, a continuous CVdd line, continuous CVss line(s), a continuous BLB 116, and a continuous RBL 150. Similarly, SRAM cells 10 within a same row share a continuous WWL and a continuous RWL. By providing different orientations of SRAM cells 10 in an SRAM array, a symmetrical grid may be repeated to form an SRAM array of any desired size. Due the symmetry of features in grid 622, common features between adjacent SRAM cells may be co-located, which advantageously reduces the overall footprint of an SRAM array in a semiconductor chip.

FIGS. 7A through 7D illustrate block diagrams of a layout of features of an SRAM current tracking cell 50A and adjacent SRAM tracking read pass-gate control cell 52A according to some embodiments. FIGS. 7A through 7D illustrates features in different levels of SRAM current tracking cell 50A and SRAM tracking read pass-gate control cell 52A (e.g., OD level, contact level, via_0 level, M1 level, via-1 level, M2 level in FIG. 3), which are consecutively described for clarity. In FIGS. 7A through 7D, dotted lines 702 designate boundaries of SRAM read current tracking cell 50A and SRAM tracking read pass-gate control cell 52A.

Figure 7A:
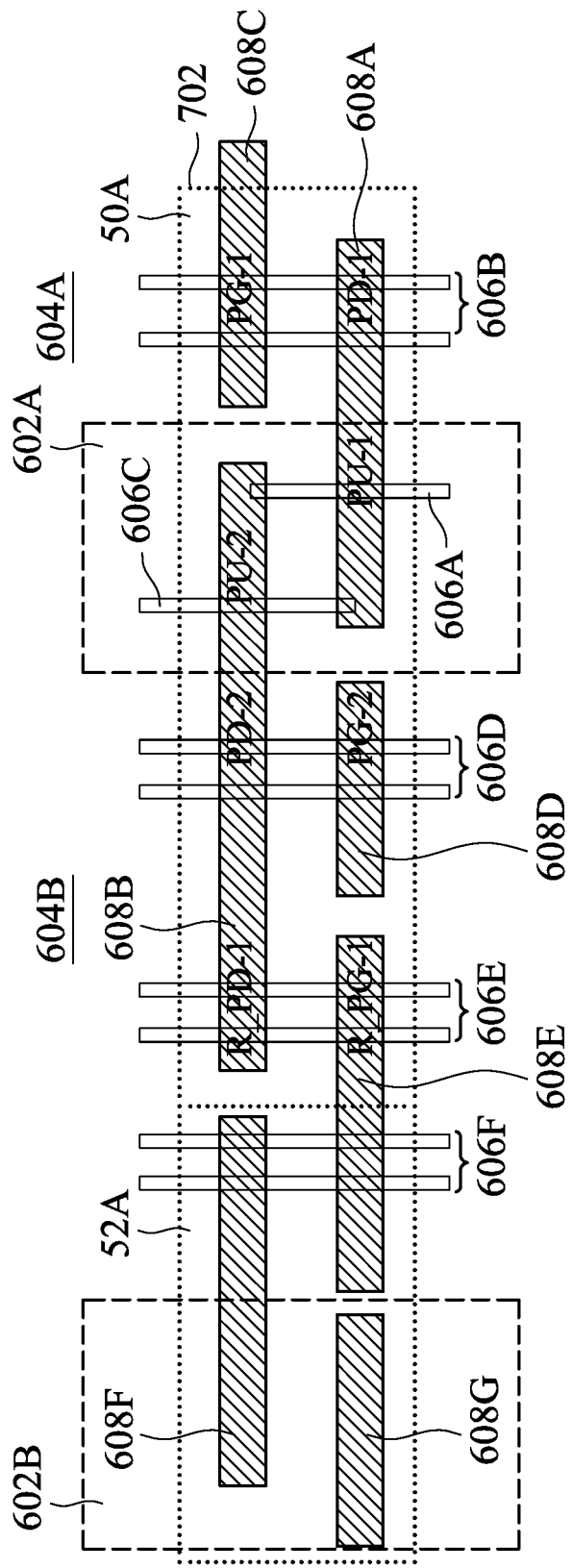
FIGS. 7A through 7D illustrate block diagrams of SRAM read current tracking cell layouts in accordance with some embodiments.

Referring first to FIG. 7A, features in the OD level and overlying gate electrodes of various transistors (see FIG. 3) in SRAM read current tracking cell 50A and adjacent SRAM tracking read pass-gate control cell 52A are illustrated. The various features in the OD level, via_0 level gate electrodes of SRAM read current tracking cell 50A may be the same as SRAM cell 10 where like reference numbers indicate like elements. For example, SRAM read current tracking cell 50A and SRAM tracking read pass-gate control cell 52A includes pass-gate transistors PG-1 and PG-2, read pass-gate transistor R_PG-1, pull-up transistors PU-1 and PU-2, pull-down transistors PD-1 and PD-2, and read pull-down transistor R_PD-1. Gate electrode 608E of read pass-gate transistor R_PG-1 may extend into the adjacent SRAM tracking read pass-gate control cell 52A.

As further illustrated by FIG. 7A, SRAM tracking read pass-gate control cell 52A includes a portion of gate electrode 608E, and SRAM tracking read pass-gate control cell 52A may be used to electrically connect gate electrode 608E to an $I_{read}$ tracking control circuit as described in greater detail below. SRAM tracking read pass-gate control cell 52A further includes other features, such as, dummy gate electrodes 608F and 608G; dummy active regions 606F, and an active region 602B, In some embodiments, active region 602B is disposed in an n-well in some embodiments. In some embodiments, dummy active regions 606F are fin-based and include one or more fin structures disposed under gate electrode 608E. For example, gate electrode 608A may extend over and along sidewalls of active regions 606F. Dummy gate electrodes 608F and 608G; dummy active regions 606F, and active region 602B may provide improved critical dimension uniformity (CDU), improved uniform topography for array inner cells (e.g., SRAM cells 10 and tracking cells 50), and/or the like. Because tracking cells 50 are disposed near edges of SRAM array 200, dummy features (e.g., dummy gate electrodes and/or dummy active regions) may be included in SRAM tracking read pass-gate control cells 52 for improved CDU performance and topography uniformity.

Figure 7B:
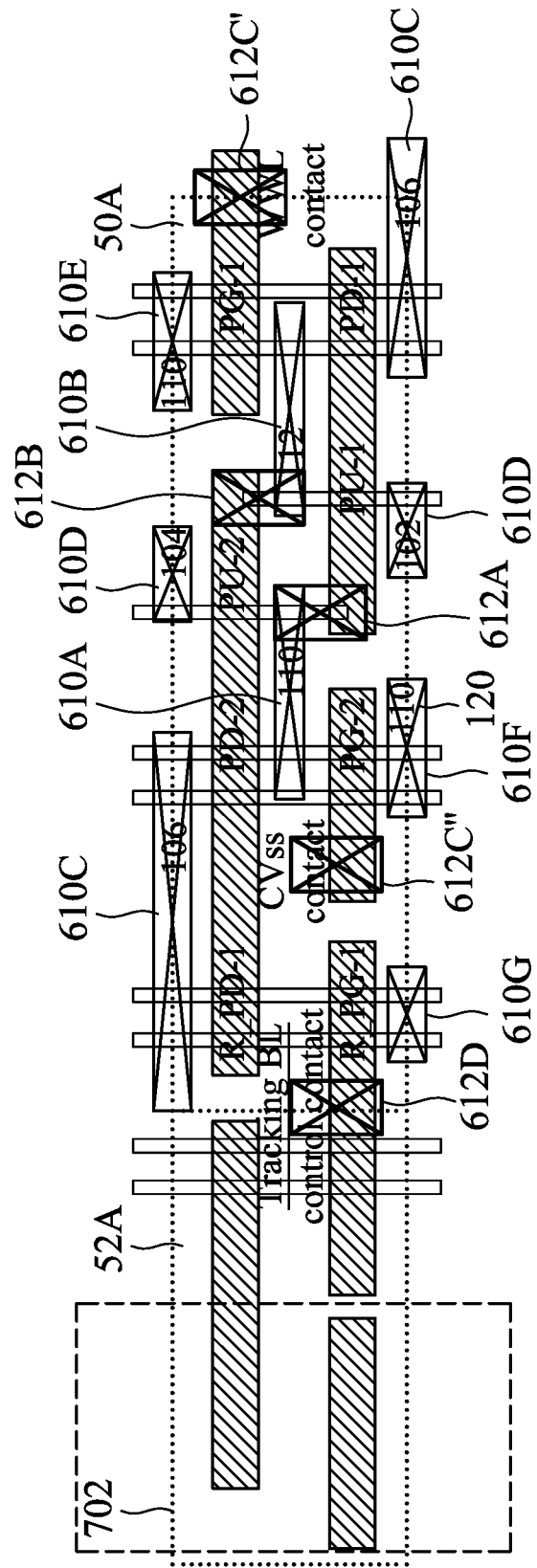

FIG. 7B illustrates features of SRAM read current tracking cell 50A and SRAM tracking read pass-gate control cell 52A in the contact level (see FIG. 3) and lower. Gates and drains of pull-up transistor PU-1/pull-down transistor PD-1 are electrically connected to respective drains and gates of pull-up transistor PU-2/pull-down transistor PD-2 to provide SD nodes 110 and 112. Gates of pull-up transistor PU-2/pull-down transistor PD-2 is further connected to read pull-down transistor R_PD-1. Additional source/drain contacts and gate contacts as described above are also provided to various active regions/gate electrodes of transistors in SRAM read current tracking cell 50A. However, in SRAM read current tracking cell 50A, gate contact 612C" (e.g., a gate contact of pass-gate transistor PG-2) is a CVss contact, not a WWL contact. Furthermore, Gate contact 612D (e.g., a gate contact of read pass-gate transistor R_PG-1) extends into SRAM tracking read pass-gate control cell 52A and is used as a tracking BL control contact, not a RBL contact. Additionally, source/drain contact 610G (e.g., a source/drain contact of read pass-gate transistor R_PG-1) is a contact to a tracking BL (e.g., tracking BL 210, see FIG. 5A), not a RWL contact.

Figure 7C:
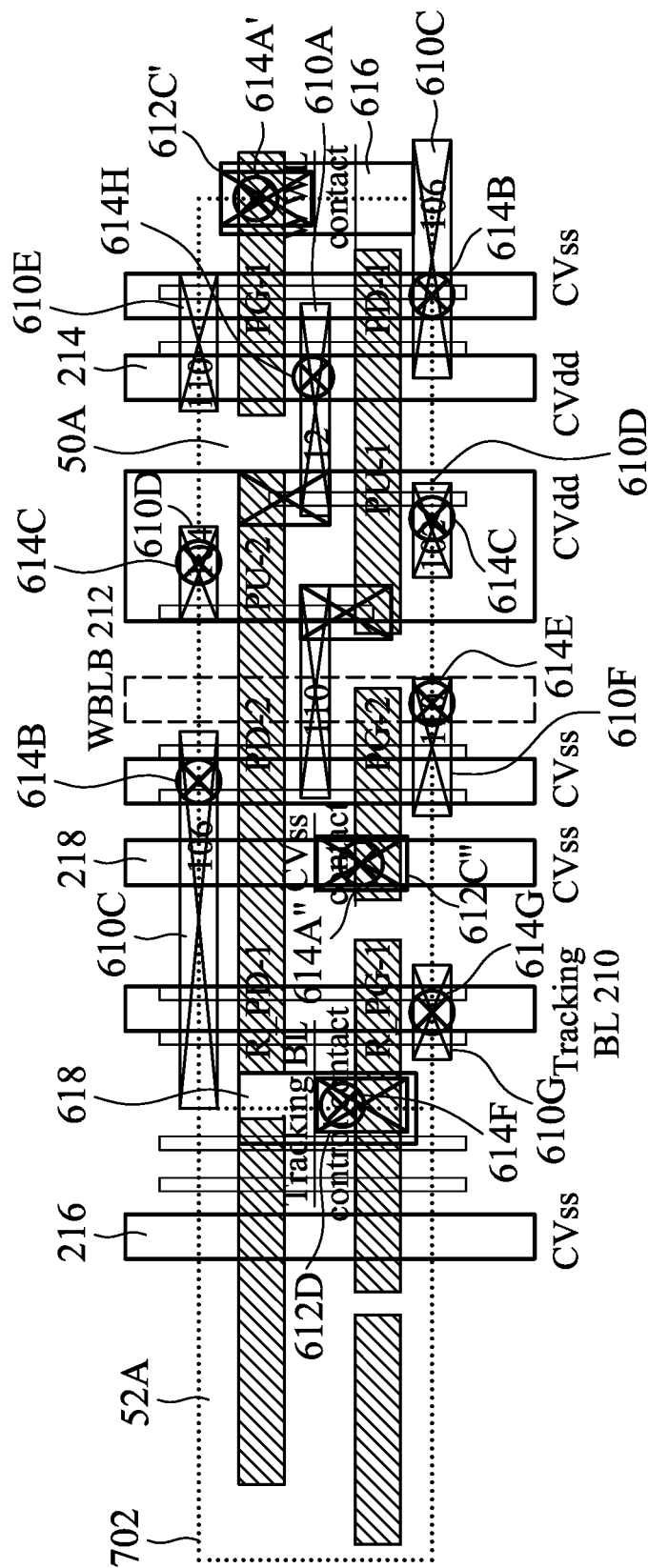

FIG. 7C illustrates features of SRAM read current tracking cell 50A and SRAM tracking read pass-gate control cell 52A in the M1 and via_0 levels (see FIG. 3) and lower. In FIG. 7C, vias 614 (labeled 614A through 614H) are disposed in the via_0 level (see FIG. 3) while conductive line 616, conductive line 618, CVdd lines, CVss lines, tracking BL 210, and optional BL 212 are disposed in the M1 level (see FIG. 3). For example, various conductive lines in the M1 level are disposed over various vias in the via_0 level.

As shown in FIG. 7C, via 614A' is connected to gate contact 612C' (e.g., a gate contact for pass-gate transistor PG-2). Via 614A' is further connected to conductive line 616, which may be used to electrically couple gate electrode of pass gate transistor PG-2 to one or more WWLs as described in greater detail with respect to FIG. 7D below. Via 614A' and conductive lines 616 may further extend into and are shared with neighboring SRAM cells 10 (e.g., writable SRAM cells) in a different column that abut SRAM current tracking cell 50A (see e.g., FIG. 4A).

Via 614A" is connected to gate contact 612C" (e.g., a gate contact for pass-gate transistor PG-1). Vias 614A" is further connected to a CVss line, which may be used to electrically couple gate electrode of pass gate transistor PG-1 to electrical ground and permanently deselect SRAM current tracking cell 50A from write operations. In other embodiments where dummy BL 212 is replaced with a tracking WBL, gate contact 612" may further connect the gate of pass-gate transistor PG-2 to a $I_{write}$ tracking control circuit as described above. In order to facilitate the connection between the gate electrode of pass-gate transistor PG-1 to CVss, an additional CVss line 218 may be included in SRAM current tracking cell 50A. For example, in FIG. 7C, two adjacent CVss lines may be disposed in parallel in the M1 layer (see FIG. 3).

Vias 614B are connected to elongated contact plugs 610C (e.g., source contacts of pull-down transistors PD-1 and PD-2). Vias 614B are further connected to CVss lines and may be used to electrically couple sources of pull-down transistors PD-1 and PD2 to Vss voltage. A via 614B may further couple a source of read pull-down transistor R_PD-1 to a CVss line, such as a CVss line in SRAM read current tracking cell 50A or a CVss line 216 in SRAM tracking read pass-gate control cell 52A. Furthermore, vias 614B may further extend into neighboring SRAM cells 10 in a different column that abut SRAM current tracking cell 50A (see FIG. 4A). Vias 614B may further be shared between two neighboring SRAM tracking cells 50 in different rows that abut each other (see FIG. 9).

Additionally, vias 614C are connected to contact plugs 610D (e.g., source contacts of pull-up transistors PU-1 and PU-2). Vias 614C are further connected to a CVdd line, which electrically connects sources of pull-up transistors PU-1 and PU-2 to positive supply voltage Vdd. Thus, vias 614C are parts of the CVdd nodes 102 and 104 (see also FIG. 1). Vias 614C may further be shared between two neighboring SRAM tracking cells 50 in different rows that abut each other (see FIG. 9). In an embodiment, a single, continuous CVdd line is shared by all SRAM tracking cells in a same column within an SRAM array.

As further illustrated by FIG. 7C, via 614E is connected to contact plug 610F (e.g., source/drain contact of pass-gate transistor PG-2). Via 614E is further connected to an optional dummy BL 212. In embodiments where dummy BL 212 is omitted, via 614E may also be optionally excluded. Via 614D of SRAM cell 10 (see FIG. 6C) may be excluded from SRAM current tracking cell 50A. In other embodiments, dummy BL 212 is replaced with a tracking WBL as described above.

Via 614F is connected to gate contact 612D (e.g., a gate contact for pass-gate transistors R_PG-1). Via 614F is further connected to conductive lines 618, which may be used to electrically couple the gate electrode of pass-gate transistor R_PG-1 to an Iread tracking control circuit 60 as described in greater detail below. Via 614F and conductive line 618 may further extend into adjacent SRAM tracking read pass-gate control cell 52A.

Via 614G is connected to contact 610G (e.g., a source/drain contact of read pass-gate transistor R_PG-1). Via 614G is further connected to a tracking BL 210. Via 614G may be shared between two neighboring SRAM tracking cells 50 in different rows that abut each other (see FIG. 9). Furthermore, as described above, SRAM tracking cells in a same column share a continuous tracking BL 210.

Via 614H is electrically connected to contact 610A (e.g., SD node 112). Via 614H is also connected to CVdd line 214. Thus, via 614H may be used to directly connect SD node 112 (and a gate of read pull-down transistor R_PD-1) to positive supply voltage Vdd, and read pull-down transistor R_PD-1 may be permanently selected in SRAM current tracking cell 50A. In order to facilitate the connection between the gate electrode of read pull-down transistor R_PD-1 to CVdd, an additional CVdd line 214 may be included in SRAM current tracking cell 50A. For example, in FIG. 7C, two adjacent CVdd lines may be disposed in parallel in the M1 layer (see FIG. 3). In some embodiments, the additional CVdd line 214 may be included in lieu of a WBL.

As further illustrated by FIG. 7C, SRAM tracking read pass-gate control cell 52A may include a portion of an optional CVss line 216. Because SRAM tracking read pass-gate control cell 52A may be disposed in a same column of SRAM tracking read pass-gate control cells 52B, which are used to disable read pass-gate transistors R_PG-1 (see e.g., FIG. 4A), optional CVss line 216 may be shared by all SRAM tracking read pass-gate control cell 52 in a column. Furthermore, CVss line 216 may optionally be used to connect a source of read pull-down transistor R_PD-1 to ground.

Figure 7D:
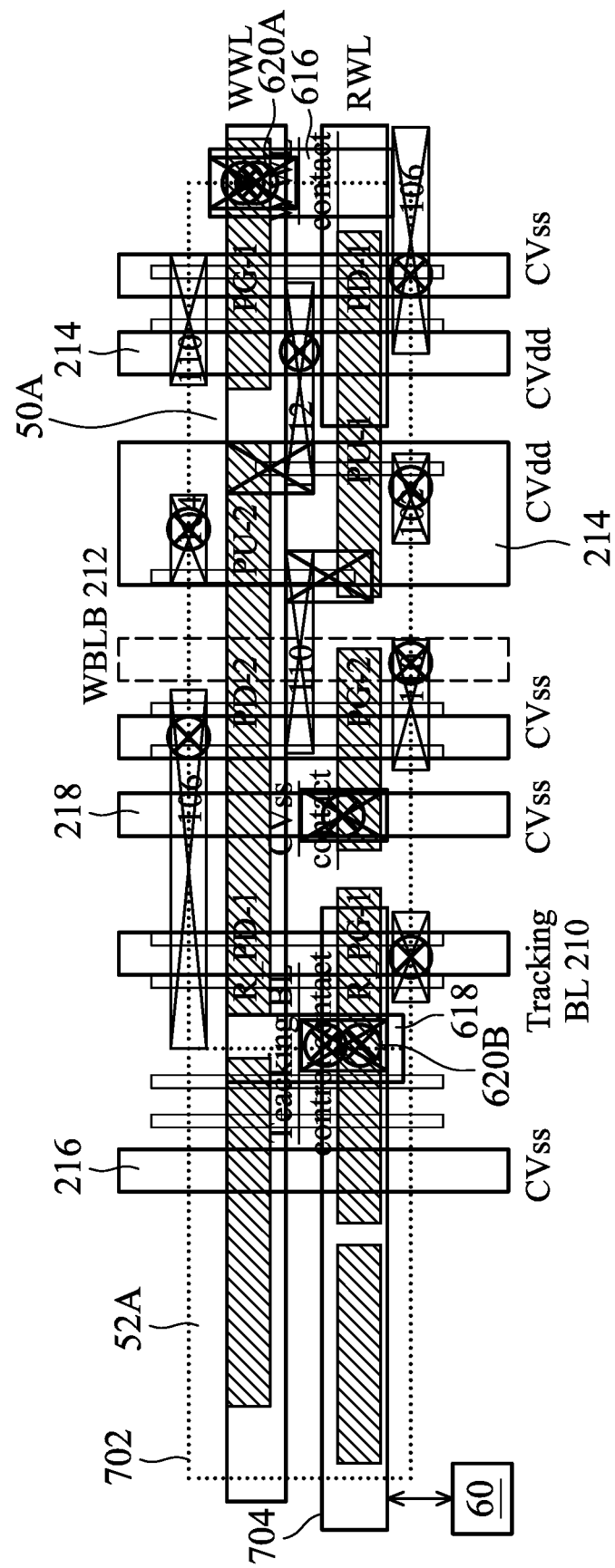

FIG. 7D illustrates features of SRAM read current tracking cell 50A and SRAM tracking read pass-gate control cell 52A in the M2 and via_1 levels (see FIG. 3) and lower. In FIG. 7D, vias 620 (labeled 620A and 620B) are disposed in the via_1 level (see FIG. 3) while the WWL, the RWL, and conductive line 704 are disposed in the M2 level (see FIG. 3). For example, various conductive lines in the M2 level are disposed over various vias in the via_1 level.

As shown in FIG. 7D, via 620A is connected to conductive line 616, which electrically connects gate contact 612C (e.g., gate contact for pass-gate transistors PG-1) to a WWL and provide a WWL node. In an embodiment, SRAM current tracking cell 50A and SRAM cells 10 in a same row share a common, continuous WWL. The WWL node may extend into and be shared with a neighboring SRAM cell 10 in a different column that abuts SRAM current tracking cell 50A (see FIG. 9).

Furthermore, vias 620B are connected to conductive line 618, which electrically connects gate contact 612D (e.g., gate contact for pass-gate transistors R_PG-1) to a conductive line 704. Conductive line 704 electrically connects a gate electrode of pass-gate transistors R_PG-1 to an $I_{read}$ tracking control circuit 60. As described above, $I_{read}$ tracking control circuit 60 applies a positive supply voltage to a gate of read pass-gate transistor R_PG-1 in order to track $I_{read}$ current of read ports in the SRAM array.

SRAM current tracking cell 50A includes a portion of a RWL, and the RWL may terminate in SRAM current tracking cell 50A. SRAM current tracking cell 50A and SRAM cells 10 in a same row share a common, continuous RWL.

FIGS. 8A through 8D illustrate block diagrams of a layout of features of an SRAM read capacitance tracking cell 50B and adjacent SRAM tracking read pass-gate control cell 52B according to some embodiments. FIGS. 8A through 8D illustrates features in different levels of SRAM read capacitance tracking cell 50B and SRAM tracking read pass-gate control cell 52B (e.g., OD level, contact level, via_0 level, M1 level, via-1 level, M2 level in FIG. 3), which are consecutively described for clarity. In FIGS. 8A through 8D, dotted lines 802 designate boundaries of SRAM read capacitance tracking cell 50B and SRAM tracking read pass-gate control cell 52B.

Figure 8A:
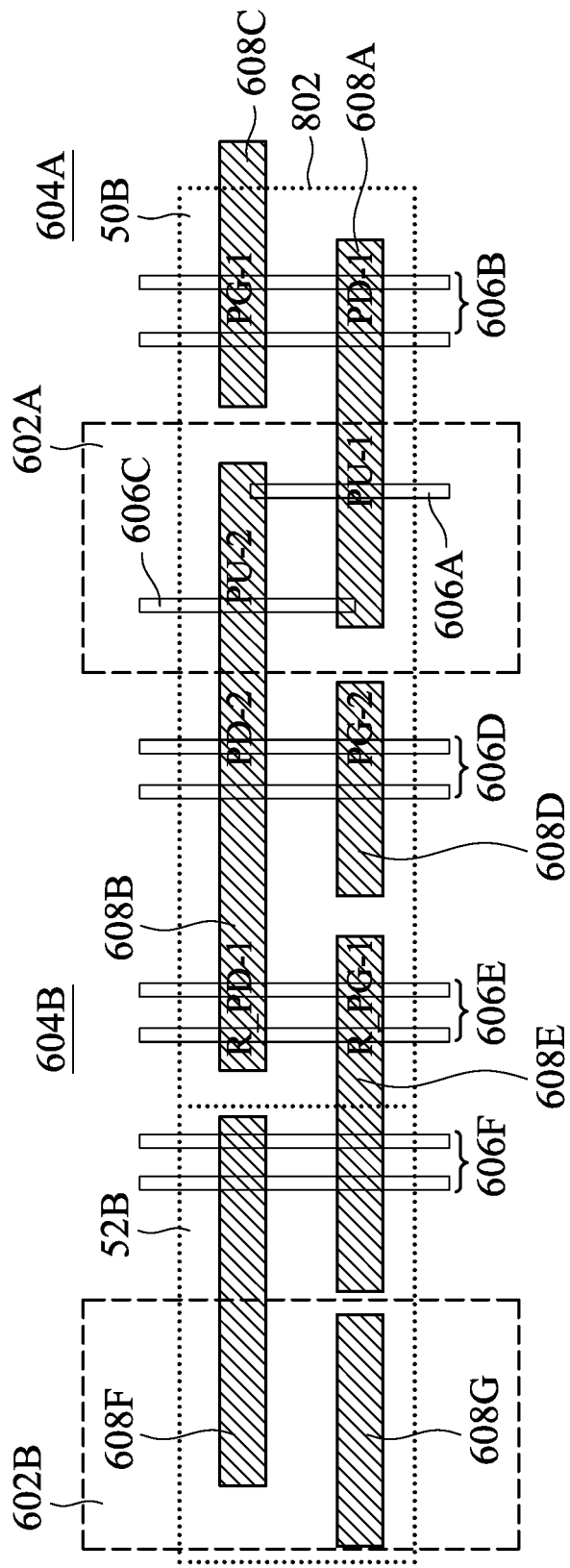
FIGS. 8A through 8D illustrate block diagrams of SRAM read capacitance tracking cell layouts in accordance with some embodiments.

Referring first to FIG. 8A, features in the OD level and overlying gate electrodes of various transistors (see FIG. 3) in SRAM read capacitance tracking cell 50B and adjacent SRAM tracking read pass-gate control cell 52B are illustrated. The various features in the OD level and gate electrodes of SRAM read capacitance tracking cell 50B may be the same as SRAM read current tracking cell 50A where like reference numbers indicate like elements. Thus, additional description of these features is omitted for brevity.

Figure 8B:
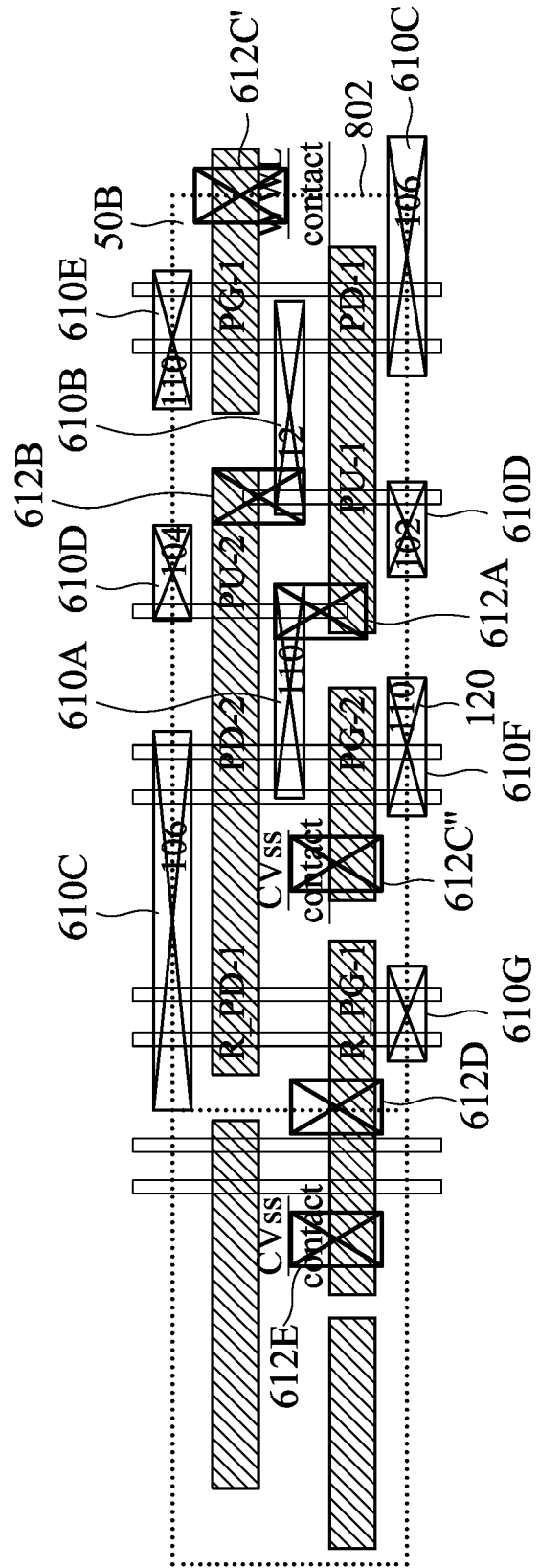

FIG. 8B illustrates features of SRAM read capacitance tracking cell 50B and SRAM tracking read pass-gate control cell 52B in the contact level (see FIG. 3) and lower. The various features in the contact level of SRAM read capacitance tracking cell 50B may be the same as SRAM read current tracking cell 50A where like reference numbers indicate like elements. Thus, additional description of these features is omitted for brevity. Furthermore, SRAM tracking read pass-gate control cell 52B includes an additional gate contact 612E, which is connected to a gate electrode of read pass-gate transistor R_PG-1. As described in greater detail below, gate contact 612E may be used to electrically connect a gate of read pass-gate transistor R_PG-1 to electrical ground. In some embodiments, gate contact 612D is included as a dummy contact for improved uniformity. In other embodiments, gate contact 612D can be omitted.

Figure 8C:
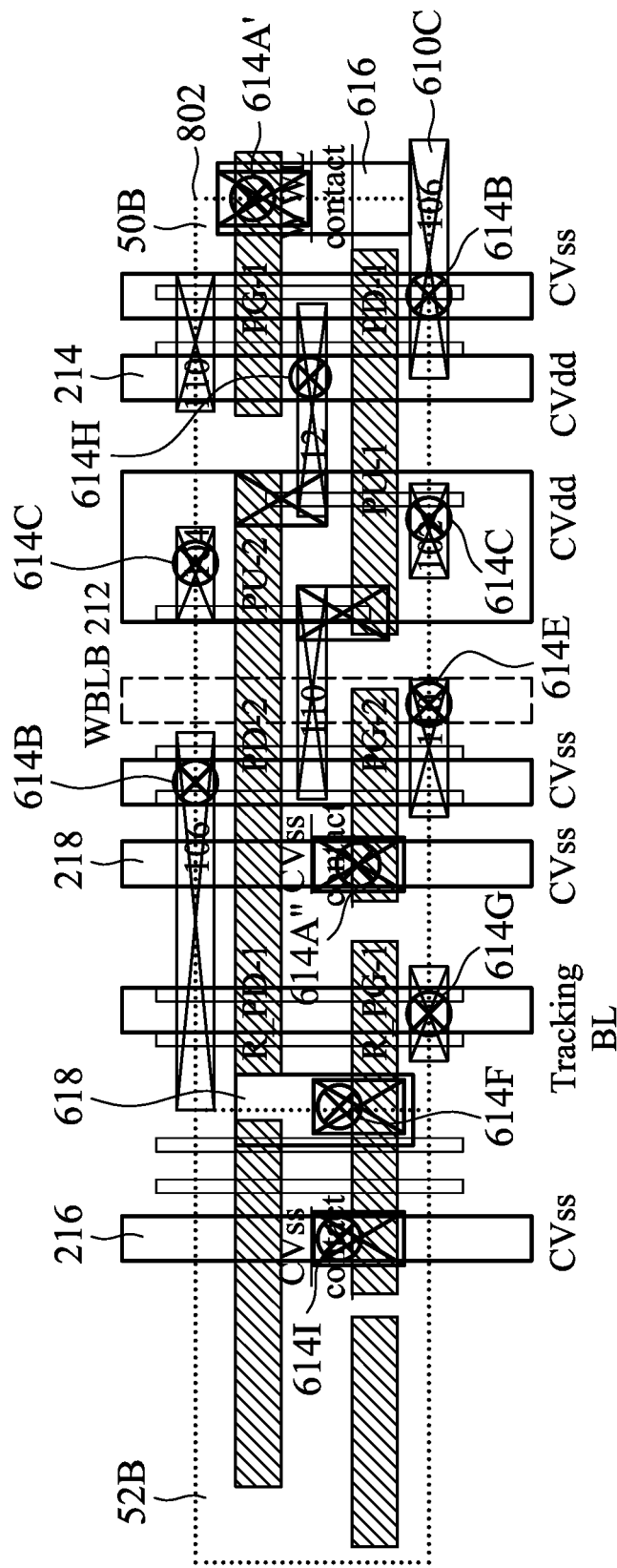

FIG. 8C illustrates features of SRAM read capacitance tracking cell 50B and SRAM tracking read pass-gate control cell 52B in the M1 and via_0 levels (see FIG. 3) and lower. The various features in the M1 and via_0 of SRAM read capacitance tracking cell 50B may be the same as SRAM read current tracking cell 50A where like reference numbers indicate like elements. Thus, additional description of these features is omitted for brevity. However, although FIG. 8C illustrates a via 614H electrically connecting SD node 112 to positive supply voltage (e.g., CVdd), in other embodiments, via 614H may be omitted from SRAM read capacitance tracking cell 50B. Furthermore, SRAM read pass-gate control cell 52B includes a via 614I in the via_1 level, which may be used to connect a gate of read pass-gate transistor R_PG-1 directly to CVss line 216. Thus, read-pass gate transistor R_PG-1 of SRAM read capacitance tracking cell 50B may be permanently disabled. CVss line 216 in SRAM read pass-gate control cell 52B may be shared with other SRAM read pass-gate control cells in a same column, including SRAM read pass-gate control cells 52A.

Figure 8D:
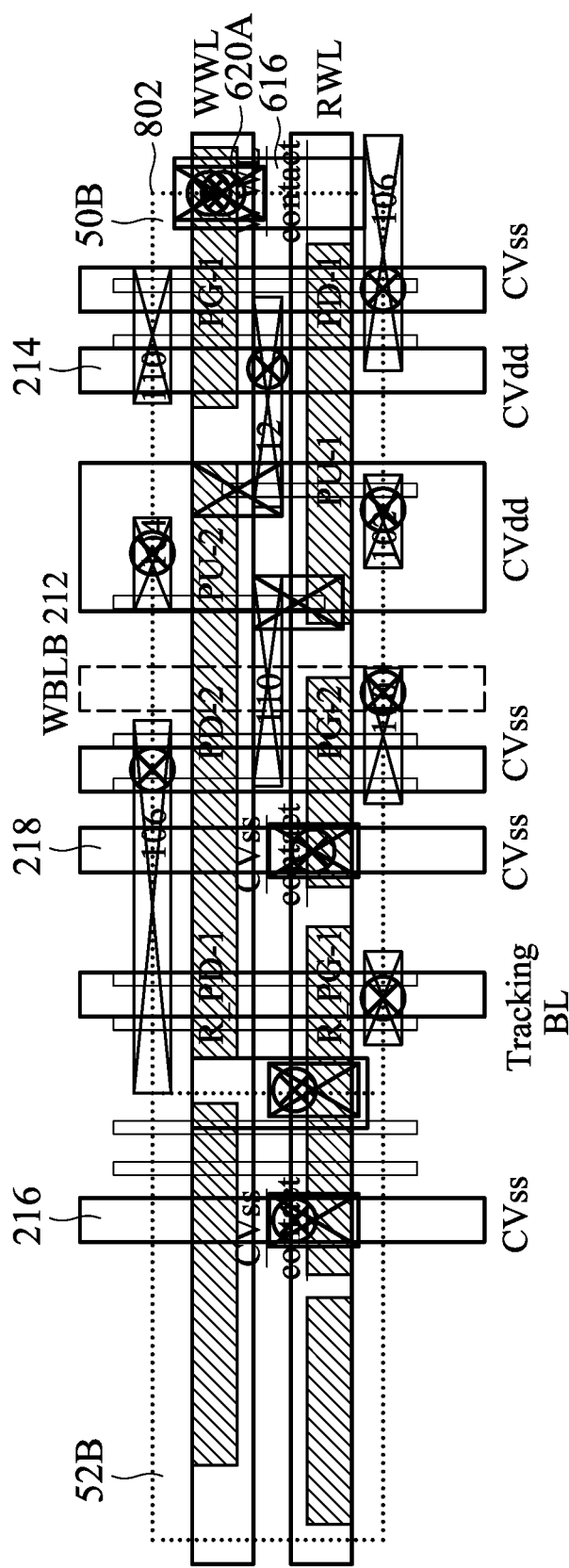

FIG. 8D illustrates features of SRAM read current tracking cell 50A and SRAM tracking read pass-gate control cell 52A in the M2 and via_1 levels (see FIG. 3) and lower. In FIG. 7D, via 620A is disposed in the via_1 level (see FIG. 3) while the WWL and the RWL are disposed in the M2 level (see FIG. 3). For example, various conductive lines in the M2 level are disposed over various vias in the via_1 level.

As shown in FIG. 8D, via 620A is connected to conductive line 616, which electrically connects gate contact 612C (e.g., gate contact for pass-gate transistors PG-1) to a WWL and provide a WWL node. In an embodiment, SRAM capacitance tracking cell 50B and SRAM cells 10 in a same row share a common, continuous WWL. The WWL node may extend into and be shared with a neighboring SRAM cell 10 in a different column that abuts SRAM capacitance tracking cell 50B. Furthermore, SRAM capacitance tracking cell 50B and SRAM read pass-gate control cell 52B includes portions of a RWL, which may be shared with other SRAM cells 10 in a same row.

Figure 9:
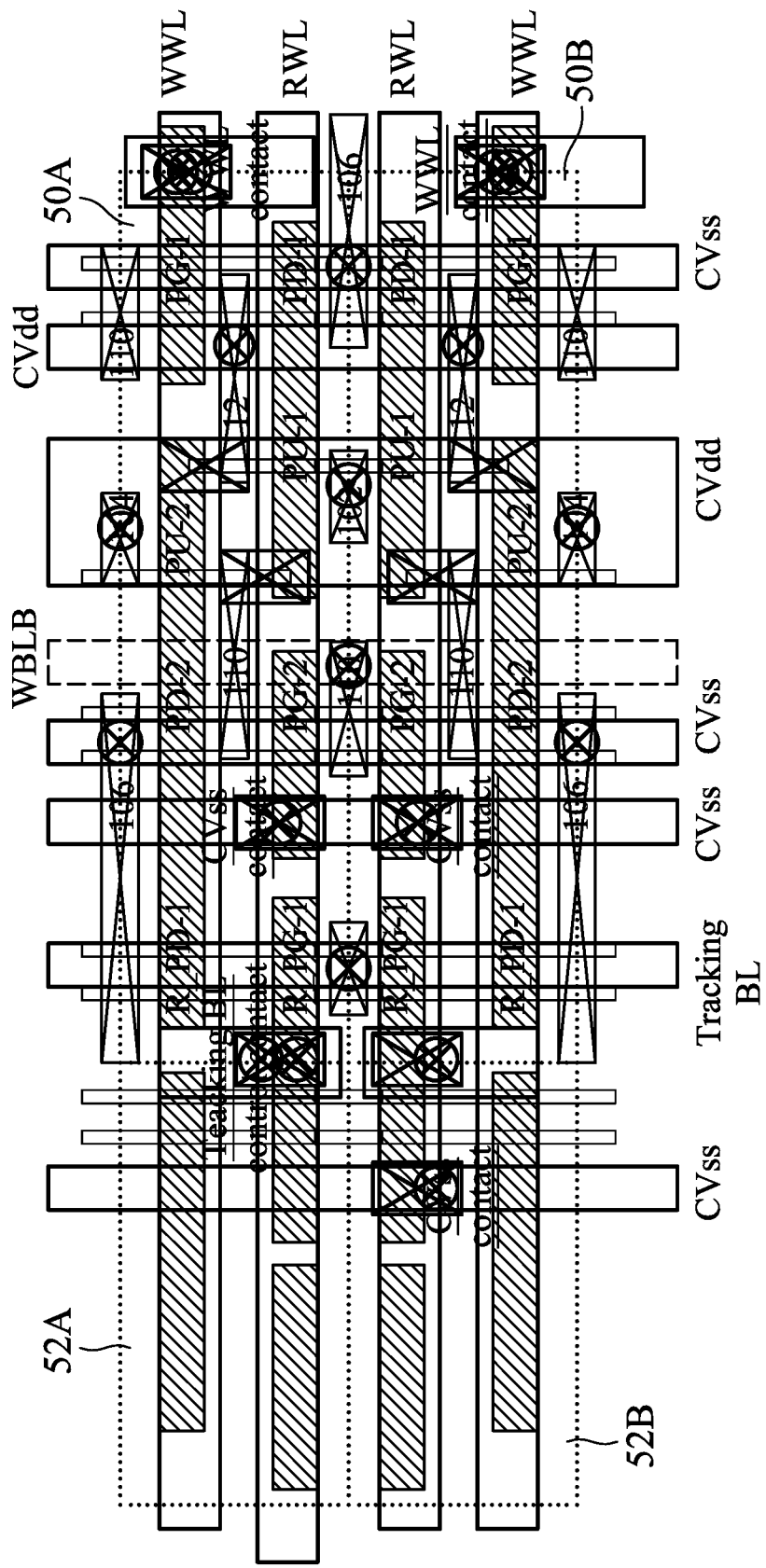
FIG. 9 illustrates a block diagram of an SRAM array layout in accordance with some embodiments.
Figure 10:
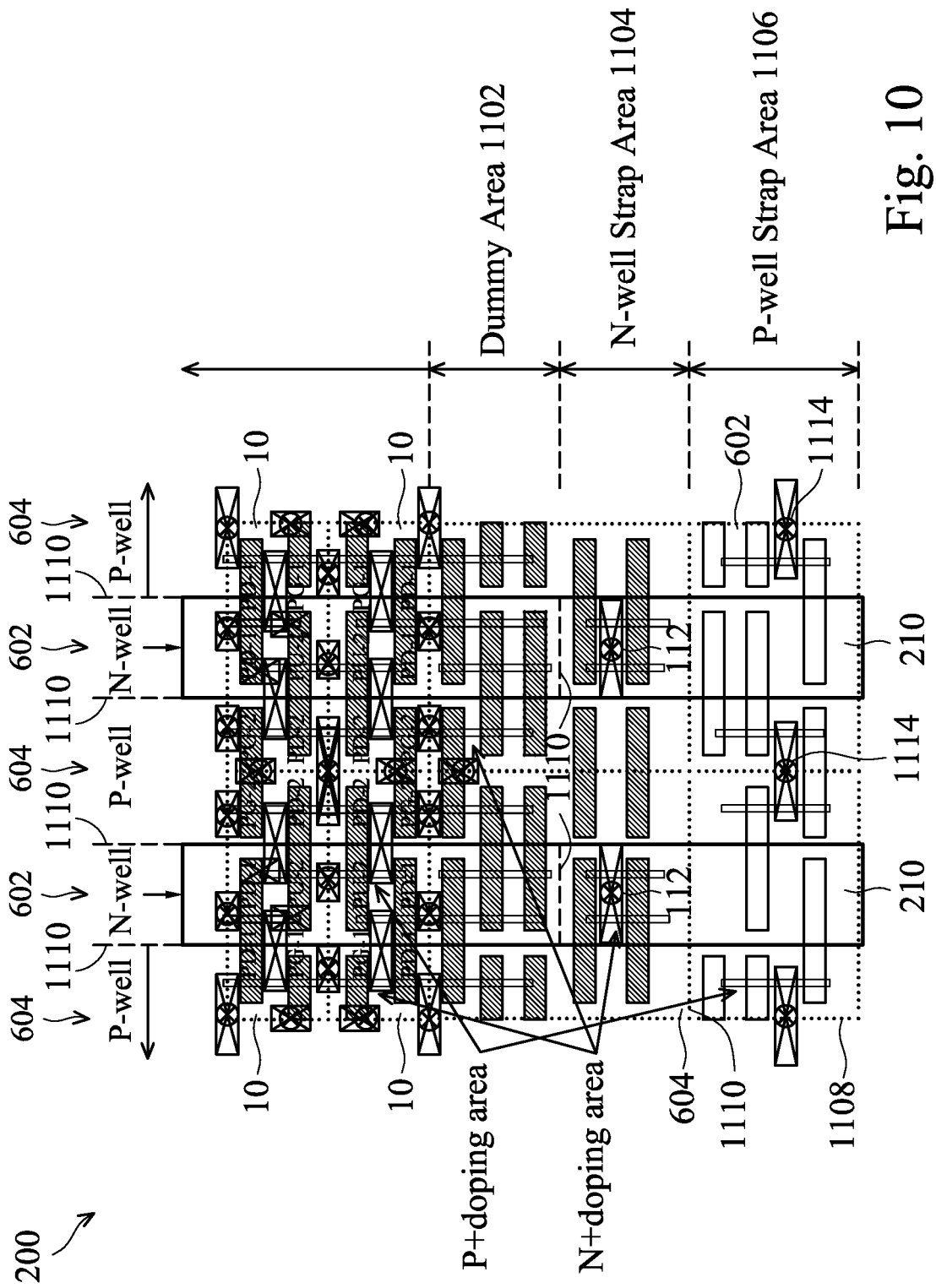
FIG. 10 illustrates a block diagram of N-well/P-well strap cells in accordance with some embodiments.

FIG. 9 illustrates block diagrams of a layout of features of an SRAM read current tracking cell, an SRAM read capacitance tracking cell, and adjacent SRAM tracking read pass-gate control cells according to some embodiments. Although FIG. 9 illustrates a combination of an SRAM read current tracking cell 50A (with adjacent SRAM tracking read pass-gate control cell 52A) and an adjacent SRAM read capacitance tracking cell 50B (with adjacent SRAM tracking read pass-gate control cell 52B), any two adjacent SRAM read tracking cells may include only current tracking cells or only capacitance tracking cells. As illustrated in FIG. 9, the orientation of SRAM read capacitance tracking cell 50B is vertically flipped along an x-axis (e.g., along a lengthwise direction of a WL) compared to the orientation of SRAM read current tracking cell 50A. Similarly, the orientation of SRAM tracking read pass-gate control cell 50B is vertically flipped along an x-axis (e.g., along a lengthwise direction of a WL) compared to the orientation of SRAM tracking read pass-gate control cell 52A. By flipping the orientation of adjacent cells as illustrated, common nodes at the boundaries of the cells may be shared and reduces the overall layout size of the SRAM array.

Thus, as described above, various embodiments provide SA timer tracking methods and structures to adjust SA timing based on detected effects of process corners on SRAM cell read port (and write port) timing. SRAM tracking cells may be deployed within an SRAM array (e.g., at edges of an SRAM array) for more robust SA timing tracking and lower area penalty. Both current and capacitance may be tracked for improved accuracy.

In accordance with an embodiment, a static random access memory (SRAM) array includes a writable SRAM cell disposed in a first row of the SRAM array and an SRAM read current tracking cell in the first row of the SRAM array. The SRAM current tracking cell includes a first read pull-down transistor and a first read pass-gate transistor. The first read pull-down transistor includes a first gate electrically connected to a first positive supply voltage line; a first source/drain electrically connected to a first ground line; and a second source/drain. The first read pass-gate transistor includes a third source/drain electrically connected to the second source/drain and a fourth source/drain electrically connected to a read tracking bit line (BL). The read tracking BL is electrically connected to a read sense amplifier timing control circuit.

In accordance with an embodiment, a static random access memory (SRAM) tracking cell includes a first gate electrode disposed over a first active region of a first inverter; a second gate electrode; and a second active region under the first gate electrode and the second gate electrode. The second active region provides a first source/drain region electrically connected to a ground line and a second source/drain region on an opposite side of the first gate electrode as the first source/drain region. The second source/drain region is further disposed between the first gate electrode and the second gate electrode. The second active region further provides a third source/drain region electrically connected to a tracking bit line (BL). The tracking BL is electrically connected to a read sense amplifier timing control circuit.

In accordance with an embodiment, a method includes disposing a static random access memory (SRAM) read current tracking cell in a same row of an SRAM array as a writable SRAM cell. The SRAM read current tracking cell includes a first inverter including a first gate; a first read pull-down transistor (having a second gate, a first source/drain, and a second source/drain); and a first read pass-gate transistor (having a third gate, a third source/drain electrically connected to the second source/drain, and a fourth source/drain). The method also includes electrically connecting the second gate to a positive power voltage supply line through a gate contact of the first gate. The method also includes electrically connecting the first source/drain to a ground line. The method also includes electrically connecting the third gate to a read current tracking control circuit. The method also includes electrically connecting the fourth source/drain to a tracking bit line (BL). The method also includes electrically connecting the tracking BL to a read sense amplifier (SA) timing control circuit.

In accordance with an embodiment, a static random access memory (SRAM) array includes a writable SRAM cell in a first row of the SRAM array; a first SRAM tracking cell in the first row of the SRAM array, the first SRAM tracking cell comprising: a first pair of cross coupled inverters; a first transistor comprising: a first gate electrically connected to an output of the first pair of cross coupled inverters; a first source/drain; and a second source/drain; and a second transistor comprising: a second gate electrically connected to a first ground line, wherein a voltage applied to the second gate is directly tied to a voltage of the first ground line; a third source/drain electrically connected to the first source/drain; and a fourth source/drain electrically connected to a read tracking bit line (BL). The read tracking BL is electrically connected to a read sense amplifier (SA) timing control circuit.

In accordance with an embodiment, a static random access memory (SRAM) tracking cell includes a first inverter comprising a first transistor and a second transistor sharing a first gate electrode; a third transistor sharing the first gate electrode with the first transistor and the second transistor, the third transistor comprising: a first source/drain electrically connected to a ground line; and a second source/drain; a fourth transistor having a second gate electrode, the fourth transistor comprising: a third source/drain, the second source/drain and the third source/drain being disposed between the first gate electrode and the second gate electrode; and a fourth source/drain; a first gate contact electrically connecting the first gate electrode to a power supply line; and a first source/drain contact electrically connecting the fourth source/drain to a tracking bit line (BL), wherein the tracking BL is electrically connected to a read sense amplifier (SA) timing control circuit.

In accordance with an embodiment, a method includes applying a positive supply voltage to a tracking bit line (BL), wherein the tracking BL is electrically connected to a read port of a static random access memory (SRAM) tracking cell, the SRAM tracking cell being disposed in a same row of an SRAM array as and having a different layout than a writable SRAM cell; determining a discharge time of the tracking BL, wherein the discharge time of the tracking BL is an amount of time taken, by the tracking BL, to discharge from the positive supply voltage to ground through the read port; and adjusting a clock cycle of a read sense amplifier (SA) in accordance with the discharge time of the tracking BL, wherein the read SA is electrically connected to a read bit line (RBL) of the writable SRAM cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
   a first plurality of writable memory cells; and
   a first cell comprising:
      a first pair of cross-coupled inverters;
      a first transistor connected to a first node of the first pair of cross-coupled inverters, wherein a voltage applied to a gate of the first transistor is directly tied to a voltage of a first supply voltage line; and
      a second transistor, wherein the first transistor serially connects the second transistor to a first ground line, wherein the second transistor comprises a source/drain connected to a read tracking bit line (BL), and wherein the read tracking BL is connected to a read sense amplifier (SA) timing control circuit of the memory array.

2. The memory array of claim 1, wherein the first cell is in a same row of the memory array as the first plurality of writable memory cells, wherein the memory array further comprises:
   a second plurality of writable memory cells; and
   a second cell in a same row of the memory array as the second plurality of writable memory cells, wherein the second cell is in a same column of the memory array as the first cell, and wherein the second cell has a different circuit layout than the first cell.

3. The memory array of claim 2, wherein the second cell comprises:
   a second pair of cross-coupled inverters;
   a third transistor; and
   a fourth transistor, wherein the third transistor serially connects the fourth transistor to the first ground line, and wherein the fourth transistor comprises:
      a gate connected to a second ground line; and
      a source/drain connected to the read tracking BL.

4. The memory array of claim 3, wherein the first ground line and the second ground line are on opposing sides of the read tracking BL.

5. The memory array of claim 2, wherein the memory array further comprises a third cell in a same column of the memory array as the first cell and the second cell, wherein the second cell is between the first cell and the third cell, and wherein the third cell has a same circuit layout as the first cell.

6. The memory array of claim 2, wherein the memory array further comprises a third cell in a same column of the memory array as and adjacent to the first cell, and wherein the third cell has a same circuit layout as the first cell.

7. The memory array of claim 6, wherein the memory array further comprises a fourth cell in a same column of the memory array as and adjacent to the second cell, and wherein the fourth cell has a same circuit layout as the second cell.

8. The memory array of claim 1 further comprising:
   a third transistor connected to a second node of the first pair of cross-coupled inverters; and
   a write tracking BL connected to a source/drain of the third transistor, wherein the write tracking BL is connected to a write SA timing control circuit of the memory array.

9. A memory array comprising:
   a first plurality of writable memory cells; and
   a first cell in a same row of the memory array as the first plurality of writable memory cells, the first cell comprising:
      a first pair of cross-coupled inverters;
      a first transistor connected to an output of the first pair of cross-coupled inverters;
      a second transistor, wherein the first transistor serially connects the second transistor to ground, wherein the second transistor comprises:
         a gate, wherein a voltage applied to the gate of the second transistor is directly tied to a voltage of a first ground line; and
         a source/drain connected to a read tracking bit line (BL), wherein the read tracking BL is connected to a read sense amplifier (SA) timing control circuit of the memory array.

10. The memory array of claim 9 further comprising:
    a second plurality of writable memory cells; and
    a second cell in a same cell in a same row of the memory array as the second plurality of writable memory cells, the second cell comprising:
       a second pair of cross-coupled inverters;
       a third transistor, wherein a voltage applied to a gate of the third transistor is directly tied to a voltage of a first supply voltage line; and
       a fourth transistor, wherein the third transistor serially connects the fourth transistor to a second ground line, wherein the fourth transistor comprises a source/drain connected to the read tracking BL.

11. The memory array of claim 10 further comprising:
    a fifth transistor connected to a node of the second pair of cross-coupled inverters; and
    a write tracking BL connected to a source/drain of the fifth transistor, wherein the write tracking BL is connected to a write SA timing control circuit of the memory array.

12. The memory array of claim 11, wherein the write tracking BL is between the first supply voltage line and the first ground line.

13. The memory array of claim 10, wherein the first supply voltage line has a greater width than the first ground line.

14. The memory array of claim 9, wherein first transistor shares a gate structure a pair of transistors of the first pair of cross-coupled inverters.

15. The memory array of claim 9, wherein the first transistor and the second transistor share a source/drain region.

16. A memory array comprising:
    a first invertor comprising a first transistor and a second transistor sharing a first gate electrode;
    a third transistor sharing the first gate electrode with the first transistor and the second transistor, the third transistor comprising a first source/drain region electrically connected to a first ground line; and
    a fourth transistor sharing a second source/drain region with the third transistor, wherein the fourth transistor comprises a second gate electrode and a third source/drain region, and wherein the second source/drain region is between the first gate electrode and the second gate electrode;
    a first gate contact electrically connecting the second gate electrode to a second ground line; and
    a first source/drain contact electrically connecting the third source/drain region to a first tracking bit line (BL), wherein the tracking BL is electrically connected to a sense amplifier (SA) timing control circuit.

17. The memory array of claim 16, wherein the tracking BL is between the first ground line and the second ground line.

18. The memory array of claim 16, wherein the tracking BL extends directly over the first gate electrode and the second gate electrode.

19. The memory array of claim 16, further comprising a second tracking bit BL on an opposing side of the first ground line opposite tracking BL.

20. The memory array of claim 16, wherein a second source/drain region of the first transistor is electrically connected to the first ground line.

* * * * *